(12) United States Patent
Kim et al.

(10) Patent No.: US 12,446,380 B2
(45) Date of Patent: Oct. 14, 2025

(54) LIGHT-EMITTING DISPLAY DEVICE

(71) Applicant: Samsung Display Co., LTD., Yongin-si (KR)

(72) Inventors: Sun Kwang Kim, Seoul (KR); Shin Moon Kang, Seoul (KR); Young Hoon Yoo, Asan-si (KR); Kye Uk Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 454 days.

(21) Appl. No.: 18/100,169

(22) Filed: Jan. 23, 2023

(65) Prior Publication Data

US 2023/0246151 A1    Aug. 3, 2023

(30) Foreign Application Priority Data

Jan. 28, 2022  (KR) .......................... 10-2022-0013641

(51) Int. Cl.
*H10H 20/857* (2025.01)
*H10H 20/831* (2025.01)

(52) U.S. Cl.
CPC ...... *H10H 20/857* (2025.01); *H10H 20/8312* (2025.01)

(58) Field of Classification Search
CPC .. H10K 59/124; H10K 59/123; H10K 59/131; H10K 59/38; H10H 20/8312; H10H 20/857; H01L 25/167; H01L 25/0753
See application file for complete search history.

(56) References Cited

U.S. PATENT DOCUMENTS

| | | | |
|---|---|---|---|
| 10,770,681 B2 * | 9/2020 | Lee | H10K 50/822 |
| 10,903,294 B2 * | 1/2021 | Bang | H10D 86/60 |
| 11,004,915 B2 * | 5/2021 | Byun | H10K 50/844 |
| 11,101,341 B2 * | 8/2021 | Choi | H10K 59/122 |
| 11,227,900 B2 * | 1/2022 | Song | H10K 50/844 |
| 11,262,967 B2 * | 3/2022 | Ye | G09G 3/3275 |
| 11,282,914 B2 * | 3/2022 | Gong | H10K 50/84 |
| 11,309,524 B2 * | 4/2022 | Lee | H10K 59/8731 |

(Continued)

FOREIGN PATENT DOCUMENTS

| KR | 100674316 | 1/2007 |
|---|---|---|
| KR | 1020140106049 | 9/2014 |

(Continued)

*Primary Examiner* — Vinh T Lam
(74) *Attorney, Agent, or Firm* — CANTOR COLBURN LLP

(57) ABSTRACT

A light-emitting display device includes a substrate, a common voltage line which is disposed on the substrate and transmits a common voltage, a first organic insulating layer which is disposed on the common voltage line and in which a first opening is defined, a connecting electrode disposed on the first organic insulating layer and connected to the common voltage line, a second organic insulating layer which is disposed on the first organic insulating layer and in which a second opening overlapping the first opening is defined, a light-emitting layer which is disposed on the connecting electrode and the second organic insulating layer and in which a contact hole that overlaps the first opening and the second opening is defined, and a common electrode disposed on the light-emitting layer and connected to the connecting electrode through the contact hole.

20 Claims, 17 Drawing Sheets

(56) References Cited

U.S. PATENT DOCUMENTS

| | | | | |
|---|---|---|---|---|
| 11,327,374 B2* | 5/2022 | Ikeda | .................. | G02F 1/13454 |
| 11,335,761 B2* | 5/2022 | Lhee | .................... | H10K 50/844 |
| 11,391,999 B2* | 7/2022 | Kim | .................... | G02F 1/13452 |
| 11,411,197 B2* | 8/2022 | Moon | .................. | H10K 59/122 |
| 11,482,511 B2* | 10/2022 | Chen | ...................... | H10H 20/01 |
| 11,508,318 B2* | 11/2022 | Ra | ........................ | H10K 59/131 |
| 11,569,477 B2* | 1/2023 | Song | .................... | H10K 50/844 |
| 11,600,676 B2* | 3/2023 | Bang | .................... | H10K 59/40 |
| 11,616,115 B2* | 3/2023 | You | .................... | H10K 59/8052 |
| | | | | 257/40 |
| 11,641,767 B2* | 5/2023 | Chae | .................... | H10K 59/131 |
| | | | | 257/40 |
| 12,010,906 B2* | 6/2024 | Hong | .................. | H10K 50/844 |
| 12,033,994 B2* | 7/2024 | Lv | .......................... | H01L 24/83 |
| 12,035,584 B2* | 7/2024 | Asaoka | ................. | H05B 33/12 |
| 12,137,590 B2* | 11/2024 | Lee | ...................... | H10K 59/122 |
| 12,144,211 B2* | 11/2024 | You | ...................... | H10K 59/124 |
| 12,178,086 B2* | 12/2024 | Han | .................... | H10K 59/124 |
| 12,283,581 B2* | 4/2025 | Kanaya | ................... | G09F 9/302 |
| 2021/0175259 A1* | 6/2021 | Tai | .................... | G02F 1/136227 |
| 2023/0100577 A1* | 3/2023 | Saitoh | ................. | H10K 59/131 |
| | | | | 257/40 |
| 2023/0178520 A1* | 6/2023 | Lin | ...................... | H10H 20/018 |
| | | | | 257/91 |
| 2025/0160143 A1* | 5/2025 | Al | ...................... | H10K 59/1201 |

FOREIGN PATENT DOCUMENTS

| | | |
|---|---|---|
| KR | 1020160081882 | 7/2016 |
| KR | 1020160087990 | 7/2016 |
| KR | 1020170047473 | 5/2017 |

* cited by examiner

LIGHT-EMITTING DISPLAY DEVICE

This application claims priority to Korean Patent Application No. 10-2022-0013641, filed on Jan. 28, 2022, and all the benefits accruing therefrom under 35 U.S.C. § 119, the content of which in its entirety is herein incorporated by reference.

BACKGROUND

(a) Field

This disclosure relates to a display device, and more particularly, to a light-emitting display device including a light-emitting diode.

(b) Description of the Related Art

As display devices, a light-emitting display device displaying an image by controlling luminance of light-emitting elements and a liquid crystal display displaying an image by controlling transmittance of a liquid crystal layer are widely used. Unlike the liquid crystal display, in the light-emitting display device, a separate light source such as a backlight is not desired, so that it is possible to reduce a thickness and weight of the display device. Further, the light-emitting display device has high-quality characteristics such as low power consumption, high luminance, and high response speed.

The light-emitting display device may include a display area corresponding to a screen displaying an image, and pixels may be disposed in the display area. The pixels may be implemented with light-emitting diodes. The light-emitting diode may include two electrodes and a light-emitting layer disposed therebetween. One of the two electrodes may be a pixel electrode provided individually for each pixel, and the other thereof may be a common electrode provided in common to a plurality of pixels.

SUMMARY

The common electrode may be connected to a common voltage line that transmits a common voltage in the display area so that the common voltage transmitted through the common electrode may be entirely and uniformly applied in the display area. In order to connect the common electrode and the common voltage line, a laser drilling process of defining an opening in the light-emitting layer may be performed. During the laser drilling process, a gas may occur from an insulating layer including an organic material due to heat applied to the light-emitting display device, and the gas may degrade the light-emitting layer.

Embodiments are to provide a light-emitting display device that may prevent degradation of a light-emitting layer.

An embodiment provides a light-emitting display device including a substrate, a common voltage line which is disposed on the substrate and transmits a common voltage, a first organic insulating layer which is disposed on the common voltage line and in which a first opening is defined, a connecting electrode disposed on the first organic insulating layer and connected to the common voltage line, a second organic insulating layer which is disposed on the first organic insulating layer and in which a second opening that overlaps the first opening is defined, a light-emitting layer which is disposed on the connecting electrode and the second organic insulating layer and in which a contact hole overlapping the first opening and the second opening is defined, and a common electrode disposed on the light-emitting layer and connected to the connecting electrode through the contact hole.

In an embodiment, the contact hole may be defined within the first opening, and may have a width narrower than a width of the first opening.

In an embodiment, the second opening may surround the first opening, and may have a width wider than a width of the first opening.

In an embodiment, the connecting electrode may contact a side surface of the first organic insulating layer defining the first opening.

In an embodiment, the first opening, the second opening, and the contact hole may overlap the common voltage line.

In an embodiment, the light-emitting display device may further include an insulating layer disposed between the common voltage line and the connecting electrode. The connecting electrode may contact the insulating layer in an area overlapping the first opening.

In an embodiment, the light-emitting display device may further include a first auxiliary pattern that is disposed between the common voltage line and the insulating layer and connected to the common voltage line. The connecting electrode may be connected to the first auxiliary pattern through a contact hole defined in the first organic insulating layer and the insulating layer.

In an embodiment, the light-emitting display device may further include a second auxiliary pattern disposed between the common voltage line and the first auxiliary pattern. The first auxiliary pattern may be connected to the second auxiliary pattern.

In an embodiment, the first opening and the second opening may overlap the first auxiliary pattern and the second auxiliary pattern.

In an embodiment, the light-emitting display device may further include an auxiliary common voltage line disposed between the common voltage line and the insulating layer and connected to the common voltage line. The first opening, the second opening, and the contact hole may overlap the auxiliary common voltage line.

In an embodiment, the light-emitting display device may further include one or more inorganic insulating layers disposed between the common voltage line and the auxiliary common voltage line. The auxiliary common voltage line may be connected to the common voltage line through a contact hole that is defined in the inorganic insulating layer and overlaps the first opening.

In an embodiment, the light-emitting display device may further include a driving voltage line disposed between the substrate and the insulating layer and transmitting a driving voltage, and an auxiliary driving voltage line disposed between the driving voltage line and the insulating layer and connected to the driving voltage line. The first opening, the second opening, and the contact hole may overlap the auxiliary driving voltage line.

In an embodiment, the second organic insulating layer may cover an edge of the connecting electrode.

Another embodiment provides a light-emitting display device including a substrate, a common voltage line which is disposed on the substrate and transmits a common voltage, a buffer layer disposed on the common voltage line, an auxiliary pattern disposed on the buffer layer and connected to the common voltage line, a first inorganic insulating layer disposed on the auxiliary pattern, a first organic insulating layer which is disposed on the first inorganic insulating layer and in which a first opening is defined, a connecting electrode disposed on the first organic insulating layer and connected to the auxiliary pattern, a second organic insulating layer disposed on the first organic insulating layer and covering an edge of the connecting electrode, a light-emitting layer which is disposed on the connecting electrode and the second organic insulating layer and in which a contact hole that overlaps the first opening is defined, and a common electrode disposed on the light-emitting layer and connected to the connecting electrode through the contact hole.

In an embodiment, the contact hole may be surrounded by the first opening.

In an embodiment, the first opening may overlap the common voltage line.

In an embodiment, the connecting electrode may cover a side surface of the first organic insulating layer defining the first opening.

In an embodiment, the connecting electrode may be connected to the auxiliary pattern through a contact hole defined in the first organic insulating layer and the first inorganic insulating layer. The contact hole defined in the first organic insulating layer and the first inorganic insulating layer may be spaced apart from the first opening.

In an embodiment, a second opening overlapping the first opening and having a width wider than a width of the first opening may be defined in the second organic insulating layer.

In an embodiment, the light-emitting display device may further include a pixel electrode disposed between the first organic insulating layer and the second organic insulating layer. The pixel electrode may constitute a light-emitting diode together with the light-emitting layer and the common electrode.

By the embodiments, it is possible to prevent a gas from occurring from an organic insulating layer in a laser irradiating area during a laser drilling process, and accordingly, it is possible to prevent degradation of a light-emitting layer due to the laser drilling process in a light-emitting display device. Further, in the embodiments, there is an advantageous effect that may be recognized throughout the specification.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
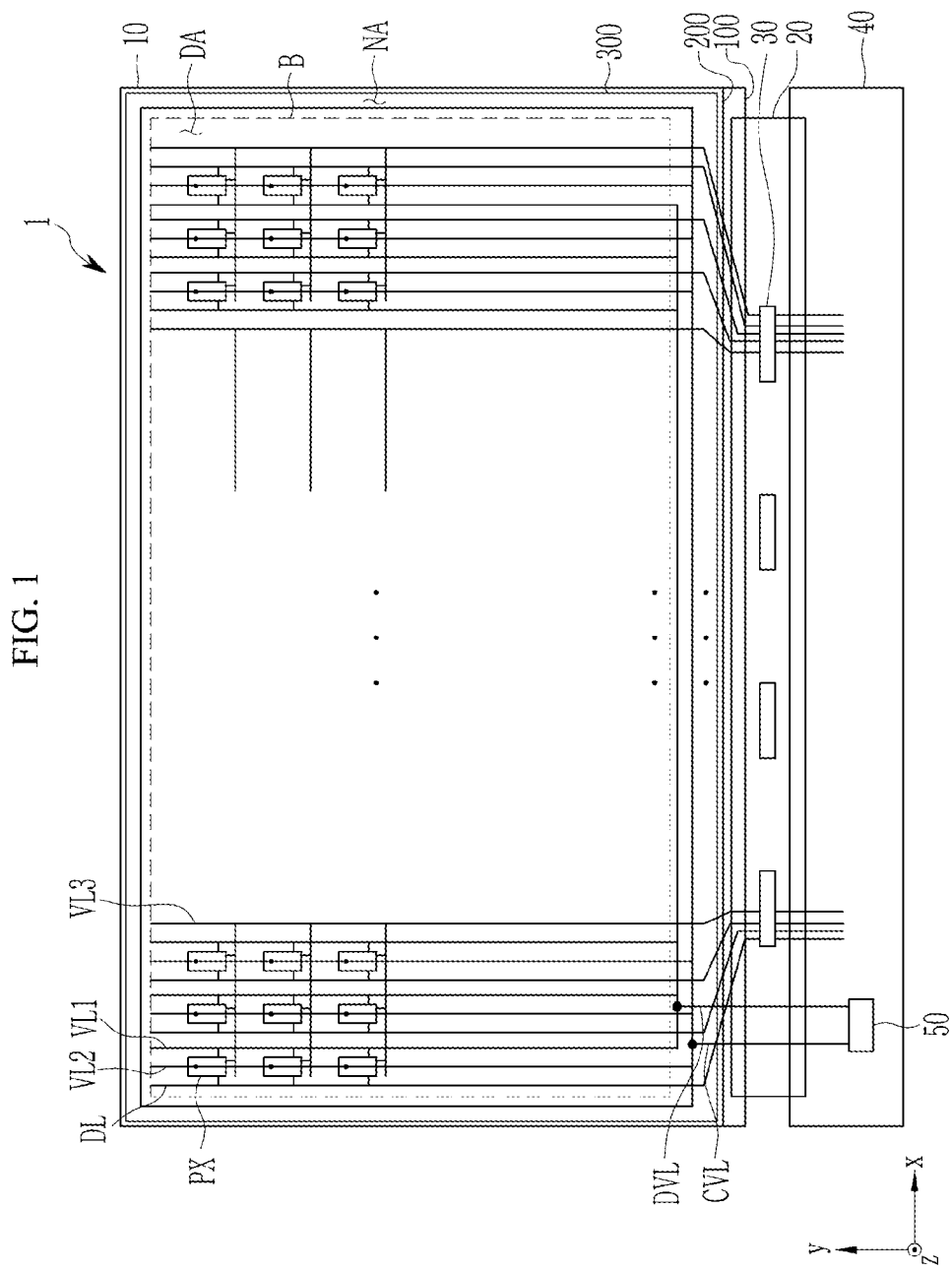
FIG. 1 illustrates a schematic plan view of an embodiment of a light-emitting display device.

This disclosure will be described more fully hereinafter with reference to the accompanying drawings, in which embodiments are shown.

It will be understood that when an element such as a layer, film, area, region, or substrate is referred to as being "on" another element, it can be directly on the other element or intervening elements may also be present. In contrast, when an element is referred to as being "directly on" another element, there are no intervening elements present.

In the specification, unless explicitly described to the contrary, the word "comprise" and variations such as "comprises" or "comprising" will be understood to imply the inclusion of stated elements but not the exclusion of any other elements.

In the specification, "connected" does not mean only when two or more elements are directly connected, but when two or more elements are indirectly connected through other elements, and when they are physically connected or electrically connected, and further, it may be referred to by different element names depending on a position or function, and may also be referred to as a case in which respective parts that are substantially integrated are linked to each other.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

In the drawings, as symbols x, y, and z used for indicating directions, 'x' is a first direction, 'y' is a second direction perpendicular to the first direction, and z is a third direction perpendicular to the first direction and the second direction. The first direction x, the second direction y, and the third direction z may correspond to a horizontal direction, a vertical direction, and a thickness direction of the display device, respectively.

FIG. 1 illustrates a schematic plan view of an embodiment of a light-emitting display device.

Referring to FIG. 1, a light-emitting display device 1 (hereinafter, also simply referred to as a "display device") includes a display panel 10, a flexible printed circuit film 20, a driving integrated circuit ("IC") chip 30, a printed circuit board 40, a power module 50, or the like.

The display panel 10 may include a display area DA corresponding to a screen that displays an image, and a non-display area NA in which circuits and/or wires for generating and/or transmitting various signals applied to the display area DA are disposed. The non-display area NA may be adjacent to the display area DA, and may surround the display area DA. In FIG. 1, an inner area and an outer area of a boundary line B may be the display area DA and the non-display area NA, respectively.

The display panel 10 may include a display portion 100 and a color converting portion 200. The display portion 100 and the color converting portion 200 may be bonded by a sealant 300 disposed around an edge of the display panel 10 between the display portion 100 and the color converting portion 200. The color converting portion 200 may overlap an entirety of the display portion 100, but the display portion 100 may include an area not covered by the color converting portion 200 for connecting or bonding of the flexible printed circuit film 20. The display portion 100 may include a pad portion (not shown) for connecting or bonding of the flexible printed circuit film 20, and in an area in which the pad portion is disposed so that the pad portion may be exposed to the outside, e.g., in a lower end portion of the display panel 10, the color converting portion 200 may be formed or provided shorter than the display portion 100. The display portion 100 and the color converting portion 200 may include areas corresponding to the display area DA and the non-display area NA of the display panel 10, respectively.

In the display area DA of the display panel 10, pixels PX may be disposed in a matrix form. However, the disclosure is not limited thereto, and the pixels PX may be disposed in various other forms. In addition, a data line DL for transmitting a data voltage $V_{DATA}$ (refer to FIG. 2), a driving voltage line VL1 for transmitting a driving voltage $EL_{VDD}$ (refer to FIG. 2), a common voltage line VL2 for transmitting a common voltage $EL_{VSS}$ (refer to FIG. 2), and an initializing voltage line VL3 for transmitting an initializing voltage $V_{INT}$ (refer to FIG. 2) may be disposed in the display area DA. The driving voltage line VL1, the common voltage line VL2, and the initializing voltage line VL3 may extend in a second direction y. The driving voltage line VL1, the common voltage line VL2, and/or the initializing voltage line VL3 may be connected to an auxiliary voltage line extending in a first direction x. Each pixel PX may receive the data voltage $V_{DATA}$, the driving voltage $EL_{VDD}$, the common voltage $EL_{VSS}$, and the initializing voltage $V_{INT}$ from these voltage lines DL, VL1, VL2, and VL3. The driving voltage $EL_{VDD}$ and the common voltage $EL_{VSS}$ are power voltages applied to each pixel PX, and the driving voltage line VL1 and the common voltage line VL2 that transmit the power voltages may be also referred to as power voltage lines. A voltage level of the driving voltage $EL_{VDD}$ may be higher than a voltage level of the common voltage $EL_{VSS}$. The driving voltage $EL_{VDD}$ may be also referred to as a first power voltage or high potential power voltage. The common voltage $EL_{VSS}$ may be also referred to as a second power voltage or a low potential power voltage.

In the non-display area NA of the display panel 10, gate drivers (not shown) may be disposed at opposite sides of the display area DA. The gate driver may be integrated in the non-display area NA. The pixels PX may receive a gate signal (also referred to as a scan signal) generated by the gate driver to receive the data voltage $V_{DATA}$ at predetermined timing.

A driving voltage transmitting line DVL connected to the driving voltage lines VL1 and a common voltage transmitting line CVL connected to the common voltage lines VL2 may be disposed in the non-display area NA of the display panel 10. The driving voltage transmitting line DVL and the common voltage transmitting line CVL may include portions substantially extending in the second direction y and portions substantially extending in the first direction x, respectively. The common voltage transmitting line CVL may be disposed to surround the display area DA. The common voltage lines VL2 may be connected to the common voltage transmitting line CVL at lower and upper sides of the display area DA, thereby uniformly providing the common voltage $EL_{VSS}$ to an entirety of the display area DA.

One end of the flexible printed circuit film 20 may be connected or bonded to the display portion 100 of the display panel 10, and the other end thereof may be connected or bonded to the printed circuit board 40. The driving IC chip 30 including a data driver for applying the data voltage $V_{DATA}$ to the data line DL may be disposed in the flexible printed circuit film 20.

The power module 50 that generates the power voltage such as the driving voltage $EL_{VDD}$ and the common voltage $EL_{VSS}$ may be disposed in the printed circuit board 40. The power module 50 may be provided in a form of an IC chip. A signal controller (not shown) that controls the data driver and the gate driver may be disposed on the printed circuit board 40.

Figure 2:
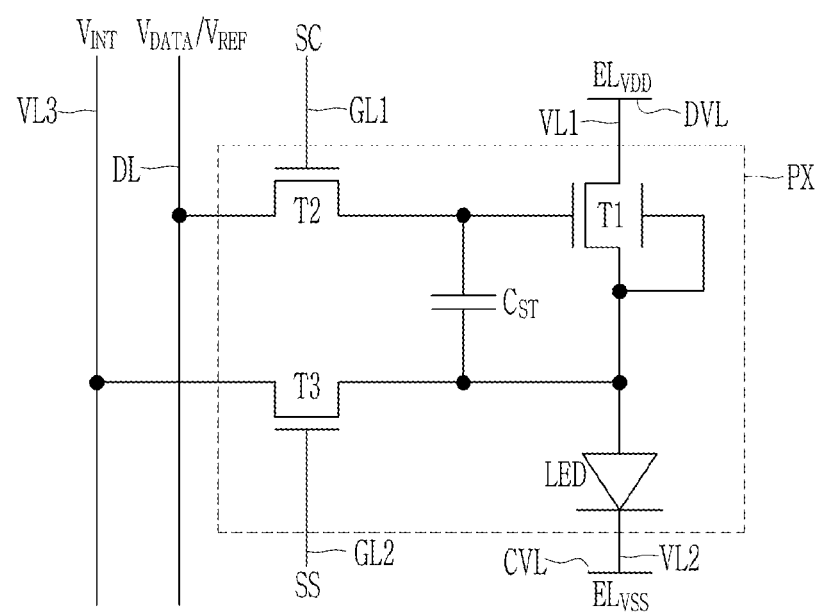
FIG. 2 illustrates a circuit diagram of one pixel of an embodiment of a light-emitting display device.

FIG. 2 illustrates a circuit diagram of an embodiment of one pixel of a light-emitting display device.

Referring to FIG. 2, one pixel PX includes first to third transistors T1 to T3, a storage capacitor $C_{ST}$, and a light-emitting diode LED. The light-emitting diode LED may be an organic or inorganic light-emitting diode. The first to third transistors T1 to T3 may be N-type transistors, but the disclosure is not limited thereto, and at least some of the first to third transistors T1 to T3 may be P-type transistors.

A gate electrode of the first transistor T1 may be connected to a first electrode of the storage capacitor $C_{ST}$. A first electrode of the first transistor T1 may be connected to the driving voltage line VL1 that transmits the driving voltage $EL_{VDD}$, and a second electrode of the first transistor T1 may be connected to an anode of the light-emitting diode LED and a second electrode of the storage capacitor $C_{ST}$. The first transistor T1 may receive the data voltage $V_{DATA}$ according to a switching operation of the second transistor T2 to supply a driving current to the light-emitting diode LED according to a voltage stored in the storage capacitor $C_{ST}$.

A gate electrode of the second transistor T2 may be connected to a first gate line GL1 that transmits a first scan signal SC. A first electrode of the second transistor T2 may be connected to the data line DL that may transmit the data voltage $V_{DATA}$ or a reference voltage $V_{REF}$. A second electrode of the second transistor T2 may be connected to the first electrode of the storage capacitor $C_{ST}$ and the gate electrode of the first transistor T1. The second transistor T2 may be turned on according to the first scan signal SC to transmit the reference voltage $V_{REF}$ or the data voltage $V_{DATA}$ to the gate electrode of the first transistor T1.

A gate electrode of the third transistor T3 may be connected to a second gate line GL2 transmitting a second scan signal SS. A first electrode of the third transistor T3 may be connected to the initializing voltage line VL3 transmitting the initializing voltage $V_{INT}$. A second electrode of the third transistor T3 may be connected to the second electrode of the storage capacitor $C_{ST}$, the second electrode of the first transistor T1, and the anode. The third transistor T3 may be turned on according to the second scan signal SS to transmit the initializing voltage $V_{INT}$ to the anode to initialize a voltage of the anode.

The first electrode of the storage capacitor $C_{ST}$ may be connected to the gate electrode of the first transistor T1, and the second electrode of the storage capacitor $C_{ST}$ may be connected to the second electrode of the third transistor T3 and the anode. A cathode of the light-emitting diode LED may be connected to the common voltage line VL2 transmitting the common voltage $EL_{VSS}$. Each light-emitting diode LED may configure one pixel PX, and the anode and the cathode of the light-emitting diode LED may be also referred to as a pixel electrode and a common electrode, respectively.

The light-emitting diode LED may emit light of a luminance (gray) according to a driving current generated by the first transistor T1.

An embodiment of the operation of the circuit shown in FIG. 2, particularly an operation during one frame, will be described in a case in which all of the transistors T1 to T3 are N-type transistors.

When one frame starts, in an initializing period, the common voltage $EL_{VSS}$ of a high level may be applied while the first scan signal SC and the second scan signal SS are at a low level. This prevents a current from flowing through the light-emitting diode LED, thereby preventing the light-emitting diode LED from emitting light. In addition, through the initializing voltage line VL3, the initializing voltage $V_{INT}$ may be applied to initialize the initializing voltage line VL3. Subsequently, the first scan signal SC of a high level and the second scan signal SS of a high level are supplied, so that the second transistor T2 and the third transistor T3 may be turned on. The reference voltage $V_{REF}$ from the data line DL may be supplied to the gate electrode of the first transistor T1 and the first electrode of the storage capacitor $C_{ST}$ through the turned-on second transistor T2, and the initializing voltage $V_{INT}$ may be supplied to the second electrode of the first transistor T1 and the anode through the turned-on third transistor T3. Accordingly, during the initializing period, the anode may be initialized with the initializing voltage $V_{INT}$. A voltage difference ($V_{REF}-V_{INT}$) between the reference voltage $V_{REF}$ and the initializing voltage $V_{INT}$ may be stored in the storage capacitor $C_{ST}$.

Next, the first scan signal SC of a high level and the second scan signal SS of a high level may be maintained in a sensing period. In this case, the initializing voltage line VL3 may be disconnected from a supply source of the initializing voltage $V_{INT}$, and may function as a sensing line. The gate electrode of the first transistor T1 and the first electrode of the storage capacitor $C_{ST}$ may maintain the reference voltage $V_{REF}$ through the second transistor T2. Accordingly, when a current flows from the first electrode of the first transistor T1 to the second electrode thereof and a voltage of the second electrode becomes a voltage difference ($V_{REF}-V_{TH}$) between the reference voltage $V_{REF}$ and the threshold voltage $V_{TH}$, the first transistor T1 may be turned off, and the initializing voltage line VL3 may be charged up to the voltage difference ($V_{REF}-V_{TH}$) between the reference voltage $V_{REF}$ and the threshold voltage $V_{TH}$. Here, the threshold voltage $V_{TH}$ represents a threshold voltage $V_{TH}$ of the first transistor T1. The initializing voltage line VL3 charged with the voltage difference ($V_{REF}-V_{TH}$) between the reference voltage $V_{REF}$ and the threshold voltage $V_{TH}$ may be connected to an external circuit, and the external circuit may sense a voltage of the initializing voltage line VL3 to extract the threshold voltage $V_{TH}$ of the first transistor T1. By generating a compensated data signal by reflecting characteristic information sensed during the sensing period, it is possible to compensate for a characteristic deviation of the first transistor T1 that may be different for each pixel PX.

Next, in a data input period, the first scan signal SC of a high level may be supplied and the second scan signal SS of a low level may be supplied, and the data voltage $V_{DATA}$ from the data line DL may be supplied to the gate electrode of the first transistor T1 and the first electrode of the storage capacitor $C_{ST}$ through the turned-on second transistor T2. The data voltage $V_{DATA}$ may have a compensated value based on the sensing of the threshold voltage $V_{TH}$ of the first transistor T1, thereby correcting a characteristic deviation of the first transistor T1. When the data voltage $V_{DATA}$ is applied, the second electrode of the first transistor T1 and the anode may substantially maintain their potentials of the sensing period by the first transistor T1 in a turned-off state.

Next, the first transistor T1 turned on by the data voltage $V_{DATA}$ transmitted to the gate electrode of the first transistor T1 in the light-emitting period may generate a driving current according to the data voltage $V_{DATA}$, and the light-emitting diode LED may emit light by the driving current. That is, the luminance of the light-emitting diode LED may be adjusted by adjusting the driving current applied to the light-emitting diode LED according to the level of the data voltage $V_{DATA}$ applied to the pixel PX.

Figure 3:
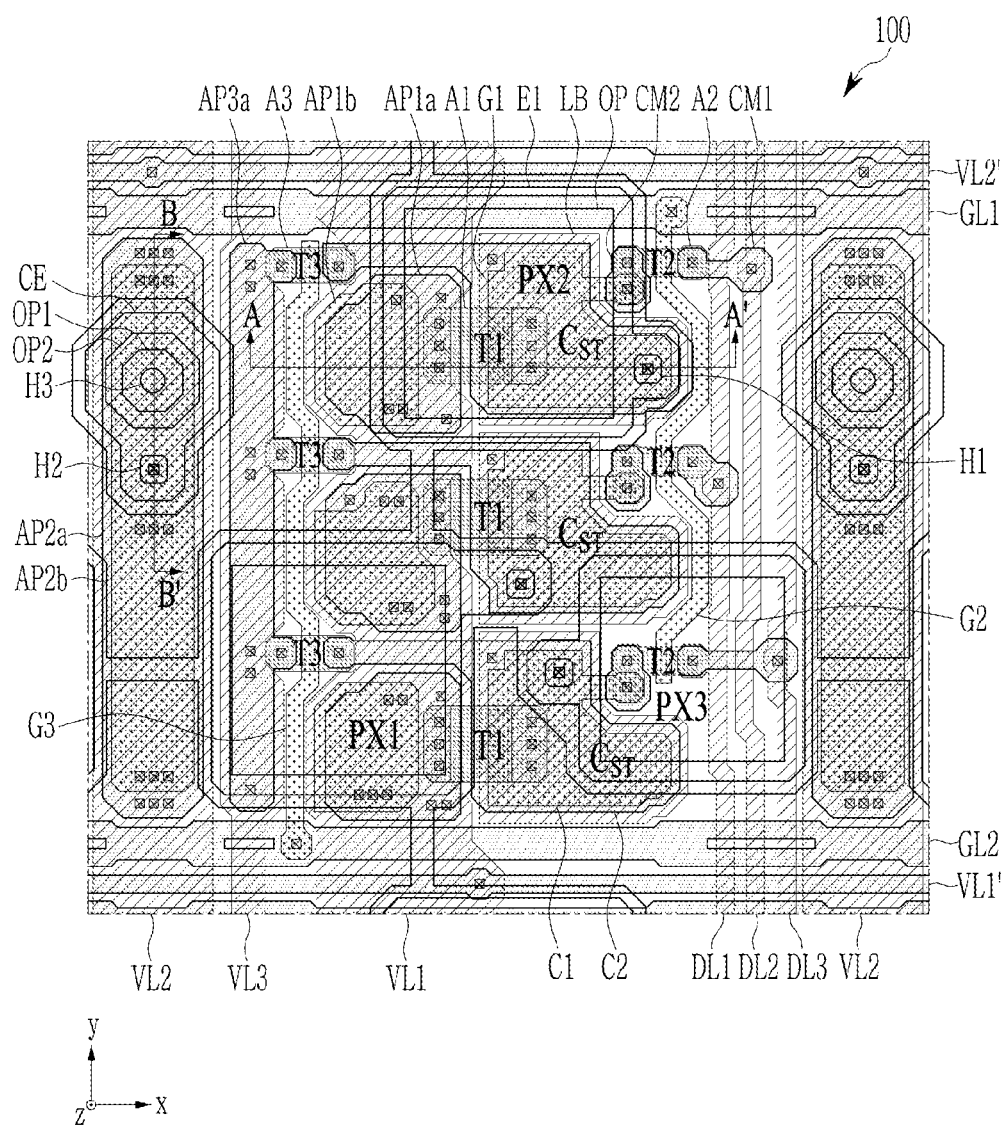
FIG. 3 illustrates a plan view of a pixel area of an embodiment of a light-emitting display device.
Figure 4:
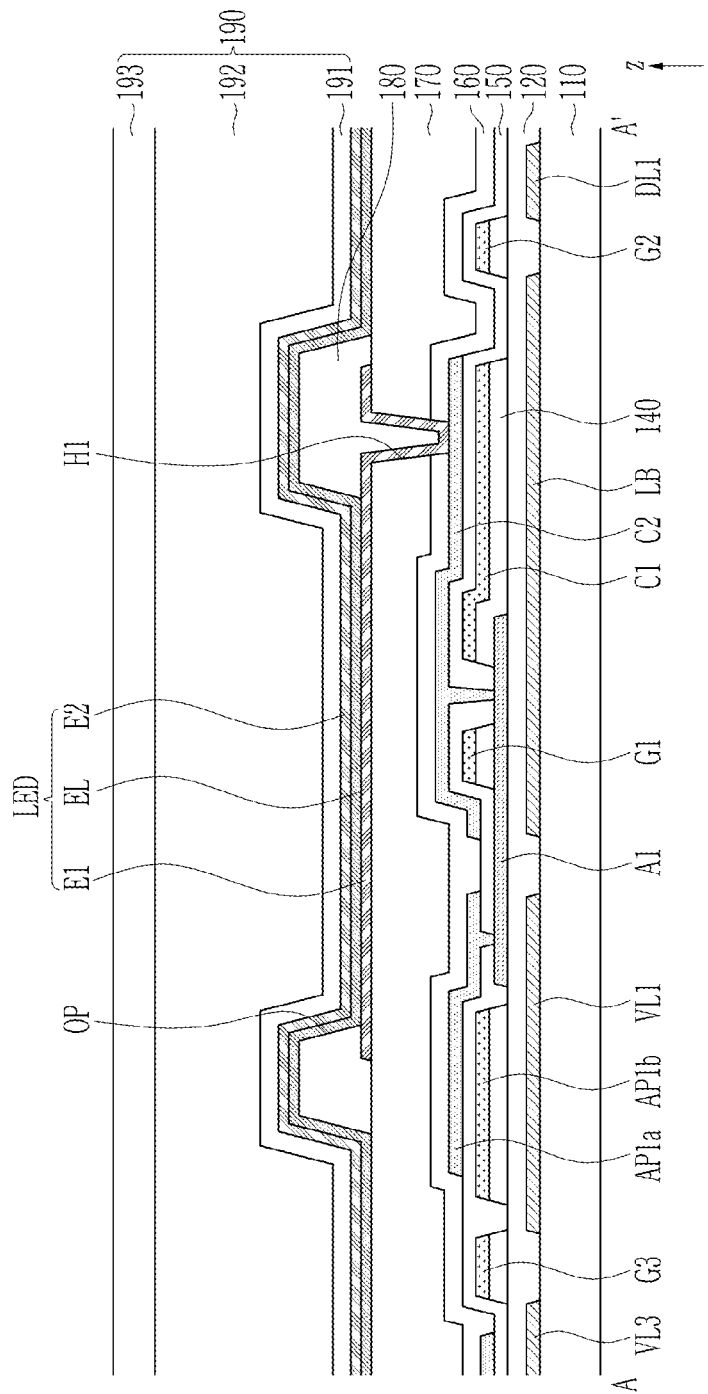
FIG. 4 illustrates a cross-sectional view taken along line A-A' of FIG. 3.
Figure 5:
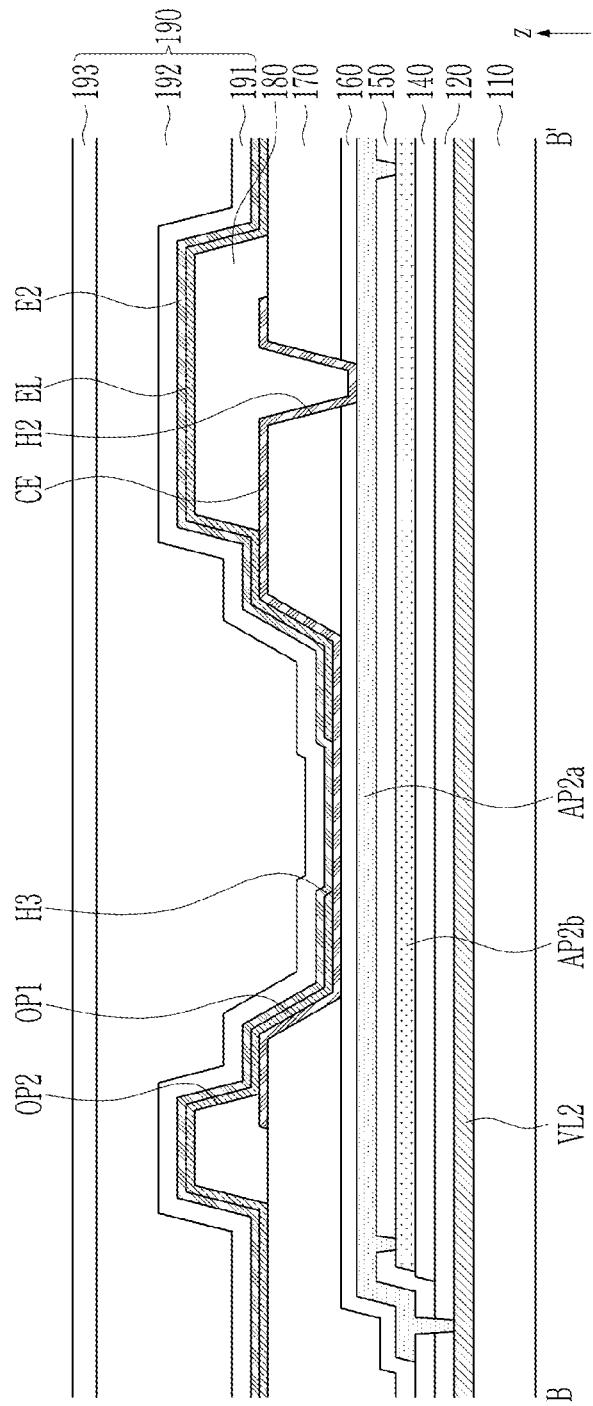
FIG. 5 illustrates a cross-sectional view taken along line B-B' of FIG. 3.

FIG. 3 illustrates a plan view of a pixel area of an embodiment of a light-emitting display device in an embodiment, FIG. 4 illustrates a cross-sectional view taken along line A-A' of FIG. 3, and FIG. 5 illustrates a cross-sectional view taken along line B-B' of FIG. 3. FIG. 6, FIG. 7, FIG. 8, FIG. 9, and FIG. 10 illustrate plan views according to a manufacturing sequence of the light-emitting display device illustrated in FIG. 3.

FIG. 3 illustrates an embodiment of three adjacent pixels PX1, PX2, and PX3 and wires connected thereto in the display panel 10 included in the display device. The pixels PX1, PX2, and PX3 may be repeatedly disposed in a matrix format. The display portion 100 of the display panel 10 will be mainly described, and the color converting portion 200 of the display panel 10 will be described later with reference to FIG. 17.

Referring to FIG. 3 to FIG. 10, the display portion 100 may include the light-emitting diode LED corresponding to each of the pixels PX1, PX2, and PX3. The pixels PX1, PX2, and PX3 may include a first pixel PX1, a second pixel PX2, and a third pixel PX3 emitting different colors. In an embodiment, one of the first pixel PX1, the second pixel PX2, and the third pixel PX3 may display red, another thereof may display green, and the other thereof may display blue, for example. However, the disclosure is not limited thereto, and the first pixel PX1, the second pixel PX2, and the third pixel PX3 may display various other colors.

The display portion 100 may basically include a substrate 110, first to third transistor T1, T2, and T3 and a storage capacitor $C_{ST}$ formed or disposed on the substrate 110, and a light-emitting diode LED connected to the first transistor T1.

The substrate 110 may include a material having a rigid characteristic such as glass, or a material having a flexible characteristic such as plastic. In an embodiment, the substrate 110 may be a glass substrate, for example. The substrate 110 may include a polymer material such as polyimide, polyamide, or polyethylene terephthalate.

Figure 6:
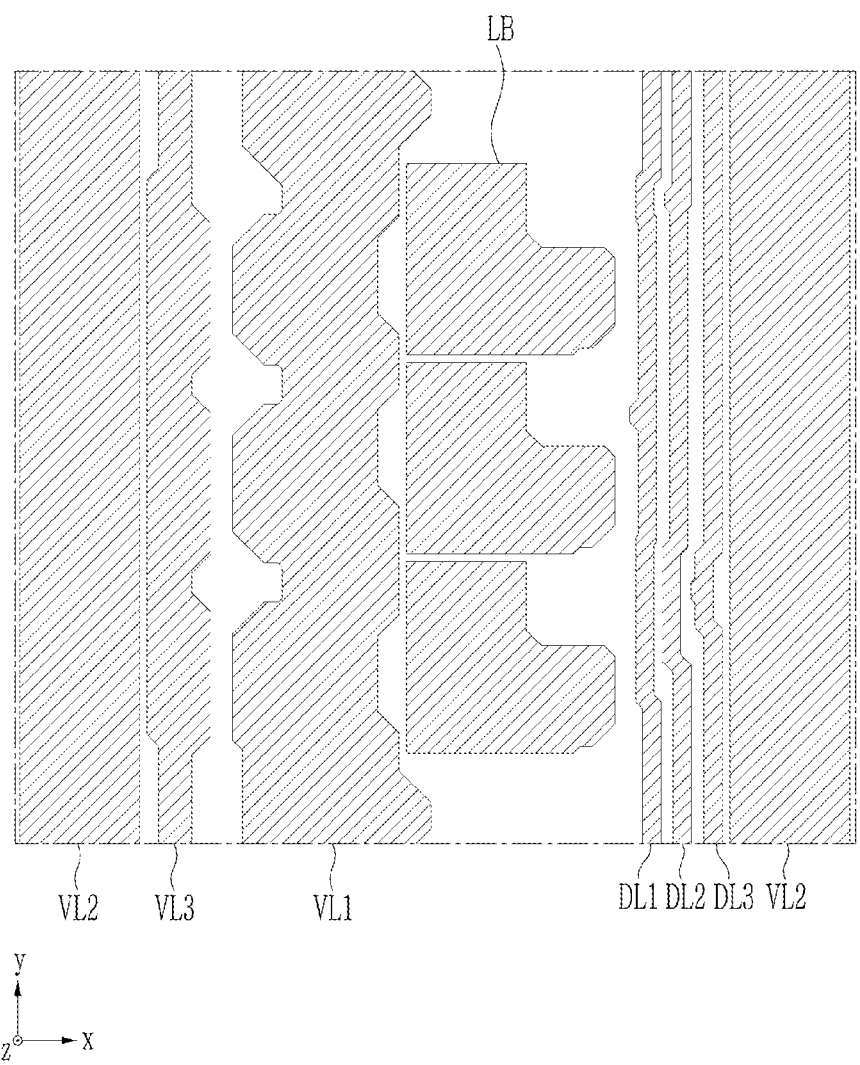
FIG. 6, FIG. 7, FIG. 8, FIG. 9, and FIG. 10 illustrate plan views according to a manufacturing sequence of the light-emitting display device illustrated in FIG. 3.

A first conductive layer that may include data lines DL1, DL2, and DL3, a driving voltage line VL1, a common voltage line VL2, an initializing voltage line VL3, and a light-blocking pattern LB may be disposed on the substrate 110. Constituent elements included in the first conductive layer may include the same material in the same process. In an embodiment, by depositing and patterning the conductive layer on the substrate 110, the data lines DL1, DL2, and DL3, the driving voltage line VL1, the common voltage line VL2, the initializing voltage line VL3, and the light-blocking pattern LB may be formed or provided, for example. FIG. 6 illustrates the first conductive layer.

The data lines DL1, DL2, and DL3 may include a first data line DL1 transmitting the data voltage $V_{DATA}$ to the first pixel PX1, a second data line DL2 transmitting the data voltage $V_{DATA}$ to the second pixel PX2, and a third data line DL3 transmitting the data voltage $V_{DATA}$ to the third pixel PX3. The first data line DL1, the second data line DL2, and the third data line DL3 may be disposed adjacent to each other in the first direction x, and may extend in the second direction y.

The driving voltage line VL1 may transmit the driving voltage $EL_{VDD}$, the common voltage line VL2 may transmit the common voltage $EL_{VSS}$, and the initializing voltage line VL3 may transmit the initializing voltage $V_{INT}$. Each of the driving voltage line VL1, the common voltage line VL2, and the initializing voltage line VL3 may extend in a second direction y.

The common voltage line VL2, the initializing voltage line VL3, the driving voltage line VL1, and the data lines DL1, DL2, and DL3 may be repeatedly dispose along the first direction x. Accordingly, in the first direction x, the driving voltage line VL1 may be disposed between the initializing voltage line VL3 and a group of the data lines DL1, DL2, and DL3, the common voltage line VL2 may be disposed between the group of the data lines DL1, DL2, and DL3 and the initializing voltage line VL3, and the initializing voltage line VL3 may be disposed between the common voltage line VL2 and the driving voltage line VL1. A relative disposition between the voltage lines VL1, VL2, and VL3 and the data lines DL1, DL2, and DL3 may be variously changed.

The light-blocking pattern LB may be disposed between the driving voltage line VL1 and the data lines DL1, DL2, and DL3. The light-blocking pattern LB may prevent external light from reaching a semiconductor layer A1 of the first transistor T1, thereby preventing characteristic deterioration of the semiconductor layer A1. A leakage current of the first transistor T1, particularly the driving transistor of which current characteristic is important in the light-emitting display device, may be controlled by the light-blocking pattern LB. The light-blocking pattern LB may function as an electrode receiving a predetermined voltage. In this case, a current change rate is reduced in a saturation region of a voltage-current characteristic graph of the first transistor T1, so that the characteristic of the driving transistor may be improved.

The first conductive layer may include a metal such as copper (Cu), aluminum (Al), titanium (Ti), molybdenum (Mo), or tungsten (W), and may be a single layer or a multilayer. In an embodiment, the first conductive layer may have a double-layered structure such as titanium (Ti)/copper (Cu), for example.

A buffer layer 120 may be disposed on the first conductive layer. The buffer layer 120 blocks impurities from the substrate 110 when the semiconductor layers A1, A2, and A3 are formed or provided to improve the characteristics of the semiconductor layers A1, A2, and A3, and flatten a surface of the substrate 110, thereby reducing stress of the semiconductor layers A1, A2, and A3. The buffer layer 120 may include an inorganic insulating material such as a silicon nitride ($SiN_x$), a silicon oxide ($SiO_x$), or a silicon oxynitride ($SiO_xN_y$). The buffer layer 120 may include amorphous silicon.

Figure 7:
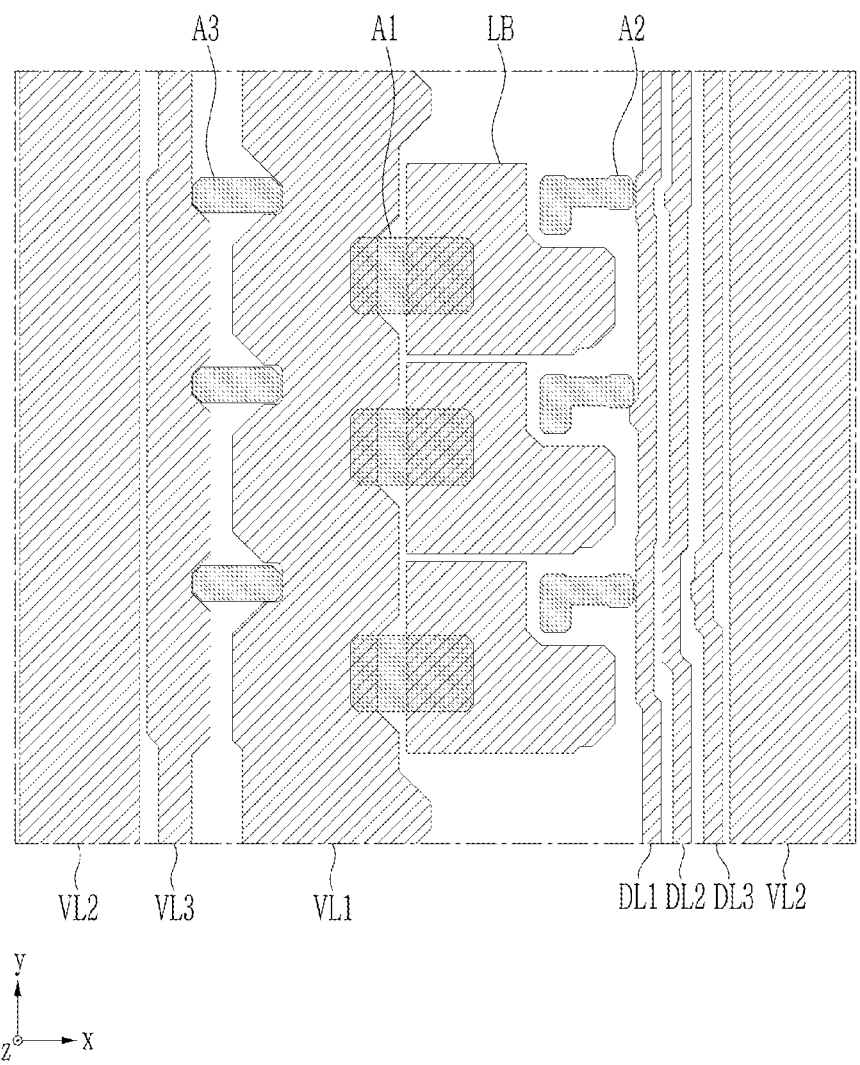

The semiconductor layers A1, A2, and A3 may be disposed on the buffer layer 120. FIG. 7 illustrates the first conductive layers and the semiconductor layers A1, A2, and A3.

The semiconductor layers A1, A2, and A3 may include a semiconductor layer A1 of the first transistor T1, a semiconductor layer A2 of the second transistor T2, and a semiconductor layer A3 of the third transistor T3. The semiconductor layers A1, A2, and A3 may include a first area, a second area, and a channel area therebetween. The semiconductor layers A1, A2, and A3 may each have a longer planar shape in the first direction x than the second direction y. The first area of the semiconductor layer A1 may overlap the driving voltage line VL1, and may be connected to the driving voltage line VL1. The second area and channel area of the semiconductor layer A1 may overlap the light-blocking pattern LB. The first area of the semiconductor layer A2 may be connected to a corresponding data line among the data lines DL1, DL2, and DL3. That is, the first area of the semiconductor layer A2 of the first pixel PX1 may be connected to the first data line DL1, the first area of the semiconductor layer A2 of the second pixel PX2 may be connected to the second data line DL2, and the first area of the semiconductor layer A2 of the third pixel PX3 may be connected to the third data line DL3. The second area of the semiconductor layer A2 may be connected to the first electrode C1 of the storage capacitor $C_{ST}$. The first area of the semiconductor layer A3 may be connected to the initializing voltage line VL3. The second area of the semiconductor layer A3 may be connected to the second electrode C2 of the storage capacitor $C_{ST}$.

The semiconductor layers A1, A2, and A3 may include an oxide semiconductor. In an embodiment, the semiconductor layers A1, A2, and A3 may include oxide semiconductors such as an indium-gallium-zinc oxide ("IGZO") including at least one of zinc (Zn), indium (In), gallium (Ga), tin (Sn), and any combinations thereof, for example. The semiconductor layers A1, A2, and A3 may include polycrystalline silicon or amorphous silicon, for example a low temperature polysilicon ("LTPS").

A first insulating layer 140 may be disposed on the semiconductor layers A1, A2, and A3. The first insulating layer 140 may be also referred to as a gate insulating layer. The first insulating layer 140 may be formed or disposed in an area overlapping gate electrodes G1, G2, and G3, a first electrode C1, and auxiliary patterns AP1b and AP2b. Such a structure may be formed by etching the first insulating layer 140 during a photolithography process for forming the gate electrodes G1, G2, and G3, the first electrode C1, and the auxiliary patterns AP1b and AP2b. The first insulating layer 140 may be formed or provided to substantially cover an entirety of the substrate 110. The first insulating layer 140 may be an inorganic insulating layer including an inorganic insulating material such as a silicon oxide, a silicon nitride, or a silicon oxynitride, and may be a single layer or a multilayer.

Figure 8:
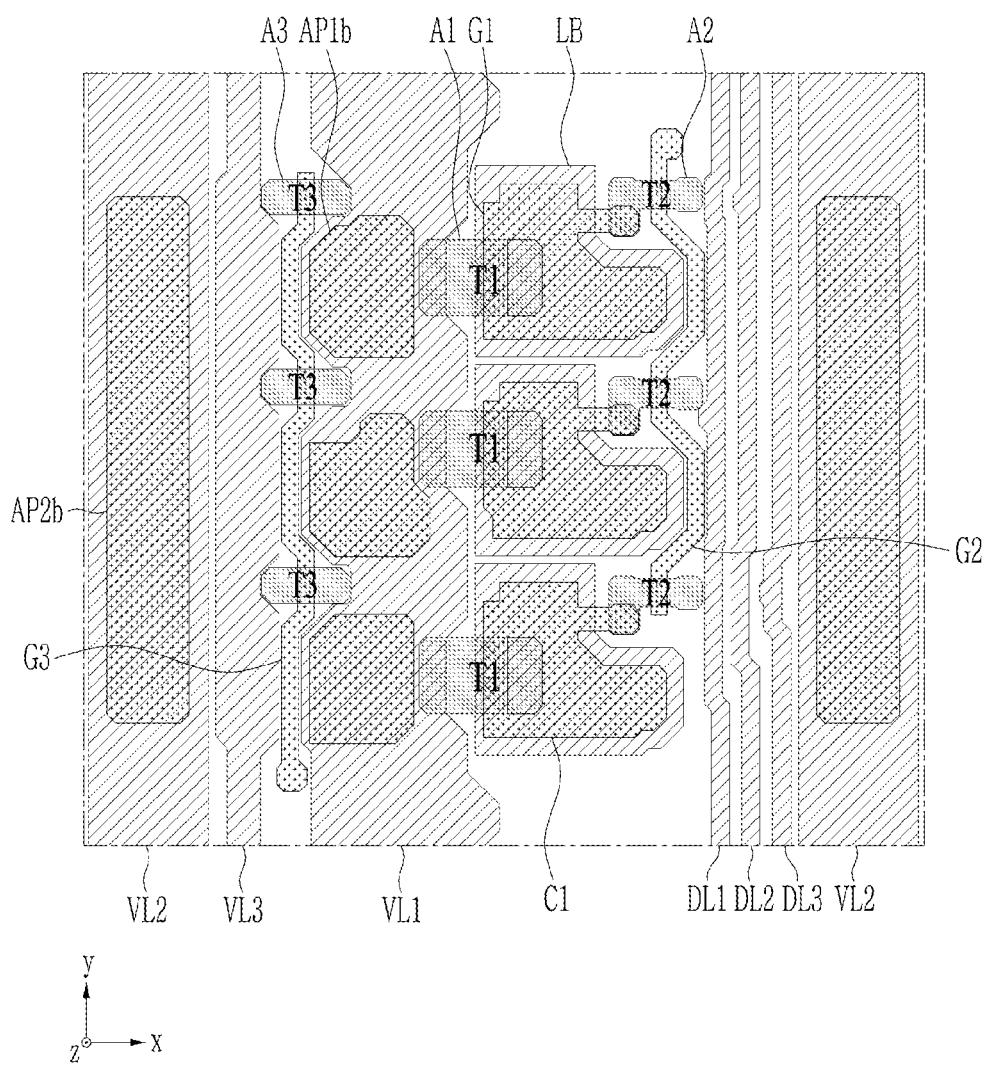

A second conductive layer that includes the gate electrode G1 of the first transistor T1, the gate electrode G2 of the second transistor T2, the gate electrode G3 of the third transistor T3, the first electrode C1 of the storage capacitor $C_{ST}$, the auxiliary pattern AP1b of the driving voltage line VL1, and the auxiliary pattern AP2b of the common voltage line VL2 may be disposed on the first insulating layer 140. Constituent elements included in the second conductive layer may include the same material in the same process. FIG. 8 illustrates the first conductive layer, the semiconductor layers A1, A2, and A3, and the second conductive layer.

The gate electrodes G1, G2, and G3 may overlap the channel areas of the corresponding semiconductor layers A1, A2, and A3. The gate electrode G1 may be extended to the first electrode C1. The gate electrode G1 and the first electrode C1 may be unitary. The gate electrode G1 and the first electrode C1 may overlap the light-blocking pattern LB. The first electrode C1 may be connected to the second area of the semiconductor layer A2. The gate electrodes G2 of the second transistors T2 of the first pixel PX1, the second pixel PX2, and the third pixel PX3 may be extended to each other and unitary. The gate electrodes G2 of the second transistors T2 of the first pixel PX1, the second pixel PX2, and the third pixel PX3 may extend in substantially the second direction y. The second transistors T2 of the first pixel PX1, the second pixel PX2, and the third pixel PX3 may receive the same first scan signal SC.

The gate electrodes G3 of the third transistors T3 of the first pixel PX1, the second pixel PX2, and the third pixel PX3 may be extended to each other and unitary. The gate electrodes G3 of the third transistors T3 of the first pixel PX1, the second pixel PX2, and the third pixel PX3 may extend in substantially the second direction y. The third transistors T3 of the first pixel PX1, the second pixel PX2, and the third pixel PX3 may receive the same second scan signal SS.

The auxiliary pattern AP1b of the driving voltage line VL1 may overlap the driving voltage line VL1. The auxiliary pattern AP1b may be disposed between the gate electrode G3 and the semiconductor layer A1 in the first direction x. A plurality of the auxiliary patterns AP1b may be disposed to be spaced apart from each other in the second direction y. The auxiliary pattern AP1b may be connected to the driving voltage line VL1 to reduce resistance of the driving voltage line VL1 and to reduce a resistive-capacitive ("RC") delay of the driving voltage $EL_{VDD}$.

The auxiliary pattern AP2b of the common voltage line VL2 may overlap the common voltage line VL2. In a plan view, the auxiliary pattern AP2b may overlap the common voltage line VL2 so that all of the auxiliary pattern AP2b is disposed within the common voltage line VL2. The auxiliary pattern AP2b may be formed or provided to be long in the second direction y, and may be disposed between the first gate line GL1 and the second gate line GL2. The auxiliary pattern AP2b may be repeatedly disposed in the second direction y. The auxiliary pattern AP2b may be connected to the common voltage line VL2 to reduce the resistance of the common voltage line VL2 and to reduce the RC delay of the common voltage $EL_{VSS}$.

The second conductive layer may include a metal such as copper (Cu), aluminum (Al), titanium (Ti), molybdenum (Mo), or tungsten (W), and may be a single layer or a multilayer. In an embodiment, the second conductive layer may have a double-layered structure such as titanium (Ti)/copper (Cu), for example.

A second insulating layer 150 may be disposed on the second conductive layer. The second insulating layer 150 may be also referred to as an inter-insulating layer. The second insulating layer 150 may be an inorganic insulating layer including an inorganic insulating material such as a silicon oxide, a silicon nitride, or a silicon oxynitride, and may be a single layer or a multilayer.

Figure 9:
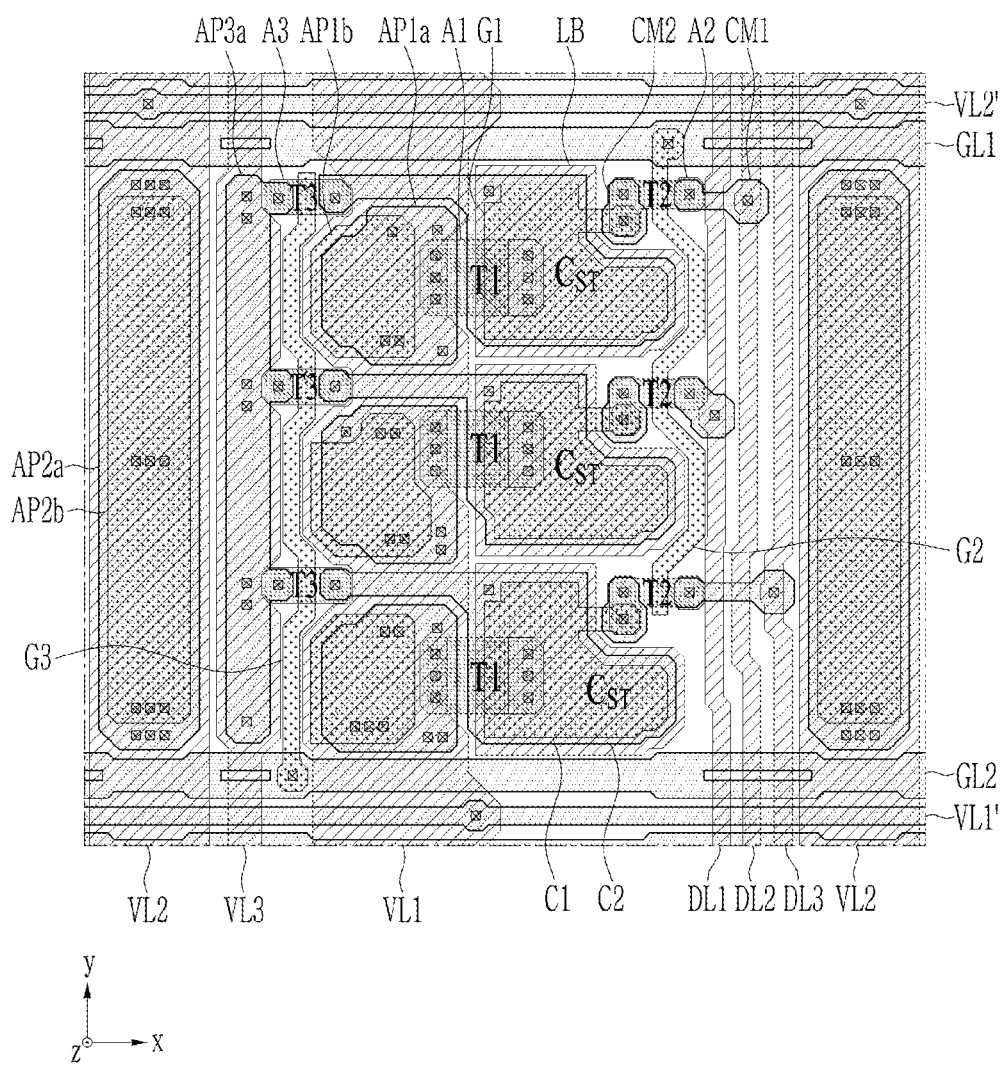

A third conductive layer that includes a first gate line GL1, a second gate line GL2, a second electrode C2 of the storage capacitor $C_{ST}$, an auxiliary driving voltage line VL1', an auxiliary common voltage line VL2', an auxiliary pattern AP1a of the driving voltage line VL1, an auxiliary pattern AP2a of the common voltage line VL2, and an auxiliary pattern AP3a of the initializing voltage line VL3 may be disposed on the second insulating layer 150. Constituent elements included in the third conductive layer may include the same material in the same process. FIG. 9 illustrates the first conductive layer, the semiconductor layers A1, A2, and A3, the second conductive layer, and the third conductive layer.

The first gate line GL1 and the second gate line GL2 may extend in the first direction x. The first gate line GL1 may be connected to the gate electrode G2 through a contact hole defined in the second insulating layer 150, and may apply the first scan signal SC. The second gate line GL2 may be connected to the gate electrode G3 through a contact hole defined in the second insulating layer 150, and may apply the second scan signal SS.

The second electrode C2 of the storage capacitor $C_{ST}$ may overlap the first electrode C1, and may configure the storage capacitor $C_{ST}$ together with the first electrode C1. The second electrode C2 may overlap the second area of the semiconductor layer A1, and an opening overlapping the second area of the semiconductor layer A1 may be defined in the first electrode C1. The second electrode C2 may be connected to the second area of the semiconductor layer A1 through the contact hole of the second insulating layer 150 and the opening of the first electrode C1. The second electrode C2 may be connected to the light-blocking pattern LB through a contact hole defined in the second insulating layer 150 and the buffer layer 120. Accordingly, the light-blocking pattern LB, the first electrode C1, and the second electrode C2 may configure a double storage capacitor $C_{ST}$. The second electrode C2 may include an extension that extends across the driving voltage line VL1 in the first direction x to overlap the second area of the semiconductor layer A3, and the extension may be connected to the second area of the semiconductor layer A3 through a contact hole defined in the second insulating layer 150.

The auxiliary driving voltage line VL1' and the auxiliary common voltage line VL2' may extend in the first direction x. The auxiliary driving voltage line VL1' may be connected to the driving voltage line VL1 through a contact hole defined in the second insulating layer 150 and the buffer layer 120. The auxiliary common voltage line VL2' may be connected to the common voltage line VL2 through the contact hole defined in the second insulating layer 150 and the buffer layer 120. Accordingly, the wires transmitting the driving voltage $EL_{VDD}$ may be connected in a mesh format in the display area DA, and may provide the uniform driving voltage $EL_{VDD}$ to an entirety of the display area DA. In addition, wires transmitting the common voltage $EL_{VSS}$ may be connected in a mesh format in the display area DA, and may provide the uniform common voltage $EL_{VSS}$ to an entirety of the display area DA.

The auxiliary pattern AP1a of the driving voltage line VL1 may overlap the driving voltage line VL1 and the auxiliary pattern AP1b. The auxiliary pattern AP1a may be disposed between the gate electrode G3 and the semiconductor layer A1 in the first direction x. A plurality of the auxiliary patterns AP1a may be disposed to be spaced apart from each other in the second direction y. The auxiliary pattern AP1a may be connected to the driving voltage line VL1 to reduce resistance of the driving voltage line VL1 and to reduce an RC delay of the driving voltage $EL_{VDD}$. The auxiliary pattern AP1a may be connected to the auxiliary pattern AP1b through a contact hole defined in the second insulating layer 150, may be connected to the driving voltage line VL1 through a contact hole defined in the second insulating layer 150 and the buffer layer 120, and may be connected to the first area of the semiconductor layer A1 through a contact hole defined in the second insulating layer 150. Accordingly, the auxiliary pattern AP1b and the first transistor T1 may be connected to the driving voltage line VL1 through the auxiliary pattern AP1a, respectively.

The auxiliary pattern AP2a of the common voltage line VL2 may overlap the common voltage line VL2 and the auxiliary pattern AP2b. In a plan view, the auxiliary pattern AP2a may overlap the common voltage line VL2 so that all of the auxiliary pattern AP2b is disposed within the common voltage line VL2. The auxiliary pattern AP2a may overlap the auxiliary pattern AP2b to cover an entirety of the auxiliary pattern AP2b. The auxiliary pattern AP2a may be formed or provided to be long in the second direction y, and may be disposed between the first gate line GL1 and the second gate line GL2. The auxiliary pattern AP2a may be repeatedly disposed in the second direction y. The auxiliary pattern AP2a may be connected to the common voltage line VL2 to reduce the resistance of the common voltage line VL2 and to reduce the RC delay of the common voltage $EL_{VSS}$. The auxiliary pattern AP2a may be connected to the auxiliary pattern AP2b through the contact hole defined in the second insulating layer 150, and may be connected to the common voltage line VL2 through the contact hole defined in the second insulating layer 150 and the buffer layer 120. Accordingly, the auxiliary pattern AP2b may be connected to the common voltage line VL2 through the auxiliary pattern AP2a.

The auxiliary pattern AP3a of the initializing voltage line VL3 may overlap the initializing voltage line VL3. The auxiliary pattern AP3a may be formed or provided to be long in the second direction y, and may be disposed between the first gate line GL1 and the second gate line GL2. The auxiliary pattern AP3a may be repeatedly disposed in the second direction y. The auxiliary pattern AP3a may be connected to the initializing voltage line VL3 to reduce the resistance of the initializing voltage line VL3 and to reduce the RC delay of the initializing voltage $V_{INT}$. The auxiliary pattern AP3a may be connected to the initializing voltage line VL3 through the contact hole defined in the second insulating layer 150 and the buffer layer 120, and may be connected to the first area of the semiconductor layer A3 through the contact hole defined in the second insulating layer 150. Accordingly, the third transistor T3 may be connected to the initializing voltage line VL3 through the auxiliary pattern AP3a.

The third conductive layer may further include a connecting member CM1 connecting the data lines DL1, DL2, and DL3 to the first area of the semiconductor layer A2, and a connecting member CM2 connecting the first electrode C1 of the storage capacitor $C_{ST}$ and the second area of the semiconductor layer A2. The connecting member CM1 may be connected to the data lines DL1, DL2, and DL3 through the contact hole defined in the second insulating layer 150 and the buffer layer 120, and may be connected to the first area of the semiconductor layer A2 through the contact hole defined in the second insulating layer 150. The connecting member CM2 may be connected to the first electrode C1 through the contact hole defined in the second insulating layer 150, and may be connected to the second area of the semiconductor layer A2 through the contact hole defined in the second insulating layer 150. Accordingly, the second transistor T2 may be connected to the data lines DL1, DL2, and DL3 through the connecting member CM1, and may be connected to the first electrode C1 through the connecting member CM2.

The third conductive layer may include a metal such as copper (Cu), aluminum (Al), titanium (Ti), molybdenum (Mo), or tungsten (W), and may be a single layer or a multilayer. The third conductive layer may include a transparent conductive material such as an indium tin oxide ("ITO") or an indium zinc oxide ("IZO"). In an embodiment, the third conductive layer may have a triple-layered structure such as titanium (Ti)/copper (Cu)/ITO, for example.

A third insulating layer 160 may be disposed on the third conductive layer. The third insulating layer 160 may be also referred to as a passivation layer. The third insulating layer 160 may be an inorganic insulating layer including an inorganic insulating material such as a silicon oxide, a silicon nitride, or a silicon oxynitride, and may be a single layer or a multilayer.

A first organic insulating layer 170 may be disposed on the third insulating layer 160. The first organic insulating layer 170 may be also referred to as a planarization layer. The first organic insulating layer 170 may include an organic insulating material such as a general purpose polymer such as poly(methyl methacrylate) and polystyrene, a polymer derivative having a phenol-based group, an acryl-based polymer, an imide-based polymer (e.g., polyimide), or a siloxane-based polymer.

An opening OP1 overlapping the common voltage line VL2 may be defined in the first organic insulating layer 170. The opening OP1 may be an area in which the first organic insulating layer 170 is removed in a third direction z, which is a thickness direction thereof. The opening OP1 may pass through the first organic insulating layer 170. The opening OP1 may overlap the auxiliary patterns AP2a and AP2b. The opening OP1 may have a substantially octagonal planar shape, but is not limited thereto. The opening OP1 may be defined by applying an organic insulating material on the third insulating layer 160 and then patterning it. During the patterning, the openings OP1 may be defined together with contact holes H1 and H2. Accordingly, an additional process for defining the opening OP1 or use of a mask may not be desired.

Figure 10:
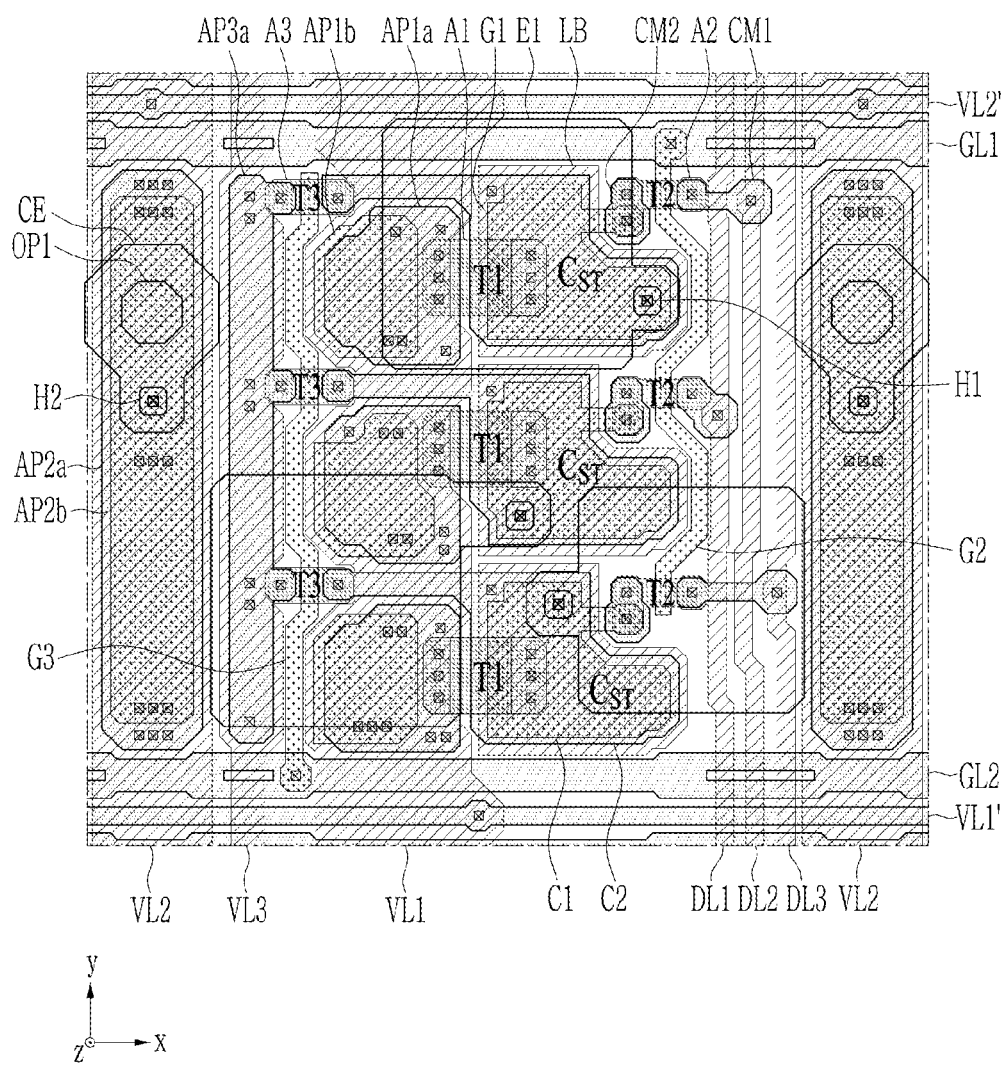

A fourth conductive layer that may include a pixel electrode E1 of the light-emitting diode LED, a connecting electrode CE thereof, or the like may be disposed on the first organic insulating layer 170. Constituent elements included in the fourth conductive layer may include the same material in the same process. FIG. 10 illustrates the first conductive layer, the semiconductor layers A1, A2, and A3, the second conductive layer, the third conductive layer, and the fourth conductive layer.

The pixel electrode E1 may be connected to the second electrode C2 through the contact hole H1 defined in the first organic insulating layer 170. The pixel electrode E1 may be connected to the second area of the semiconductor layer A1 through the second electrode C2.

The connecting electrode CE may overlap the common voltage line VL2 and the auxiliary patterns AP2a and AP2b. The connecting electrode CE may be connected to the auxiliary pattern AP2a of the common voltage line VL2 through the contact hole H2 defined in the first organic insulating layer 170 and the third insulating layer 160. The contact hole H2 may be spaced apart from the opening OP1 in the second direction y. The connecting electrode CE may be disposed in the opening OP1 of the first organic insulating layer 170, and may contact the third insulating layer 160. The connecting electrode CE may contact a side surface of the first organic insulating layer 170 defining the opening OP1, and may cover a side surface of the first organic insulating layer 170 defining the opening OP1. In a plan view, the connecting electrode CE may include a portion formed or provided in a substantially octagonal shape and a portion protruding from one side of the octagonal shape toward the contact hole H2.

The fourth conductive layer may include a reflective conductive material or a semi-transmissive conductive material, or may include a transparent conductive material. The pixel electrode E1 may include a transparent conductive material such as an ITO or an IZO. The pixel electrode E1 may include a metal such as lithium (Li), calcium (Ca), aluminum (Al), silver (Ag), magnesium (Mg), or gold (Au). The pixel electrode E1 may have a multi-layered structure, and for example, may have a triple-layered structure such as ITO/silver (Ag)/ITO.

A second organic insulating layer 180 may be disposed on the fourth conductive layer. The second organic insulating layer 180 may be also referred to as a pixel defining layer. The second organic insulating layer 180 may include an organic insulating material such as an acryl-based polymer, an imide-based polymer, or an amide-based polymer. The second organic insulating layer 180 may include a black pigment. In an embodiment, the second organic insulating layer 180 may include a polyimide binder and a pigment mixed with red, green, and blue, for example. The second organic insulating layer 180 may include a cardo binder resin and a combination of a lactam black pigment and a blue pigment. The second organic insulating layer 180 may include a carbon black. The second organic insulating layer 180 including a black pigment may improve a contrast ratio, and may prevent reflection by a metal layer disposed thereunder.

The second organic insulating layer 180 may cover an edge of the pixel electrode E1 and an edge of the connecting electrode CE. The second organic insulating layer 180 may be removed in an area excluding the area covering the edge of the pixel electrode E1 and the edge of the connecting electrode CE. An opening OP overlapping the pixel electrode E1 and an opening OP2 overlapping the opening OP1 may be defined in the second organic insulating layer 180. The openings OP and OP2 may be an area in which the second organic insulating layer 180 is removed in a third direction z, which is a thickness direction thereof. The opening OP may overlap the pixel electrode E1. The opening OP2 may overlap the common voltage line VL2 and the auxiliary patterns AP2a and AP2b. In a plan view, the opening OP2 may have an area larger than an area of the opening OP1 and may surround the opening OP1, and the opening OP1 may be defined within the opening OP2. The opening OP2 may have a width wider than a width of the opening OP1. The opening OP2 may have a substantially octagonal planar shape, but is not limited thereto.

A light-emitting layer EL may be disposed on the fourth conductive layer. The light-emitting layer EL may be disposed on an entirety of the pixels PX1, PX2, and PX3. The light-emitting layer EL may be continuously disposed on an entirety of the display area DA. The light-emitting layer EL may contact the pixel electrode E1 through the opening OP of the second organic insulating layer 180. A contact hole H3 overlapping the openings OP1 and OP2 may be defined in the light-emitting layer EL. The contact hole H3 may overlap the common voltage line VL2 and the auxiliary patterns AP2a and AP2b. In a plan view, the contact hole H3 may be surrounded by the openings OP1 and OP2, and may be defined within the openings OP1 and OP2. The contact hole H3 may have a width narrower than a width the opening OP1. The contact hole H3 may have a circular or elliptical planar shape, but is not limited thereto.

The light-emitting layer EL may include a light-emitting material emitting blue light. The light-emitting layer EL may include a light-emitting material that emits red light or green light in addition to blue light. The light-emitting layer EL may include a plurality of light-emitting layers, and the plurality of light-emitting layers may include light-emitting layers emitting light of the same color or light-emitting layers emitting light of different colors. In an embodiment, the light-emitting layer EL may have a structure in which three blue light-emitting layers are stacked, for example. In another embodiment, the light-emitting layer EL may have a structure in which three blue light-emitting layers and one green light-emitting layer are stacked. At least one of a hole injection layer, a hole transporting layer, an electron transporting layer, and an electron injection layer may be disposed on the pixel electrode E1 in addition to the light-emitting layer EL.

A common electrode E2 may be disposed on the light-emitting layer EL. The common electrode E2 may be disposed on an entirety of the pixels PX1, PX2, and PX3. The common electrode E2 may be continuously disposed on an entirety of the display area DA. The common electrode E2 may be connected to the connecting electrode CE through the contact hole H3 defined in the light-emitting layer EL. Since the connecting electrode CE is connected to the common voltage line VL2, the common electrode E2 may be connected to the common voltage line VL2 through the connecting electrode CE to receive the common voltage $EL_{VSS}$. Accordingly, the common electrode E2 may uniformly receive the common voltage $EL_{VSS}$ in an entirety of the display area DA, so it is possible to improve the voltage drop due to the resistance of the common electrode E2, and it is possible to prevent a luminance deviation from occurring in the display area DA.

The contact hole H3 defined in the light-emitting layer EL for connecting the common electrode E2 to the connecting electrode CE may be formed by a laser drilling process. Specifically, after forming the light-emitting layer EL, by irradiating a laser onto a portion of the light-emitting layer EL overlapping the openings OP1 and OP2 to remove the portion, the contact hole H3 passing through the light-emitting layer EL in the third direction z, which is a thickness direction thereof, may be defined. Accordingly, the connecting electrode CE overlapping the contact hole H3 may be exposed. Then, when the common electrode E2 is formed or provided, the common electrode E2 may be connected to the connecting electrode CE through the contact hole H3. During the laser drilling process, a temperature of the area where the laser is irradiated may increase, and in particular, a temperature of the connecting electrode CE under the contact hole H3 and a layer in contact therewith may increase. When the layer of which the temperature increases is an organic insulating layer, a gas may occur from the organic insulating layer. The occurring gas may diffuse to the surroundings and propagate to the light-emitting layer EL to deform or deteriorate the light-emitting layer EL. When the light-emitting layer EL is deformed or deteriorated, shrinkage in which the light-emitting area of the pixels PX1, PX2, and PX3 is reduced may occur. According to the embodiment, since the first organic insulating layer 170 has already been removed during the laser drilling process, that is, the opening OP1 surrounding the contact hole H3 is defined, gas is prevented from occurring from the first organic insulating layer 170 in the area where the laser is irradiated.

The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li). The common electrode E2 may include a transparent conductive oxide such as an ITO or an IZO. The common electrode E2 may have a multi-layered structure, and for example, may have a double-layered structure such as magnesium (Mg)/silver (Ag).

The pixel electrode E1, the light-emitting layer EL, and the common electrode E2 may configure the light-emitting diode LED, which may be an organic light-emitting diode. The pixel electrode E1 may be individually provided for each of the pixels PX1, PX2, and PX3 to receive a driving current. The common electrode E2 may be provided in common to the pixels PX1, PX2, and PX3 to receive a common voltage. The pixel electrode E1 may be an anode that is a hole injection electrode and the common electrode E2 may be a cathode that is an electron injection electrode, and vice versa. The opening OP of the second organic insulating layer 180 may correspond to a light-emitting area of the light-emitting diode LED.

An encapsulation layer 190 may be disposed on the common electrode E2. The encapsulation layer 190 may seal the light-emitting diodes LED, and may prevent moisture or oxygen from penetrating from the outside. The encapsulation layer 190 may cover an entirety of the display area DA, and an edge of the encapsulation layer 190 may be disposed in the non-display area NA.

The encapsulation layer 190 may be a thin film encapsulation layer including a first inorganic layer 191, an organic layer 192, and a second inorganic layer 193. The first inorganic layer 191 and the second inorganic layer 193 may mainly prevent penetration of moisture or the like, and the organic layer 192 may mainly planarize a surface of the encapsulation layer 190, particularly a surface of the second inorganic layer 193 in the display area DA. The first inorganic layer 191 and the second inorganic layer 193 may include an inorganic insulating material such as a silicon oxide or a silicon nitride. The organic layer 192 may include an organic material such as an acryl-based resin, a methacrylic resin, a polyisoprene, a vinyl-based resin, an epoxy-based resin, a urethane-based resin, a cellulose-based resin, or a perylene-based resin.

The first inorganic layer 191 and the second inorganic layer 193 may be formed or provided to be wider than the organic layer 192, and the first inorganic layer 191 and the second inorganic layer 193 may contact each other near an edge of the encapsulation layer 190. An edge of the first inorganic layer 191 and an edge of the second inorganic layer 193 may substantially coincide. By widely forming the first inorganic layer 191 and the second inorganic layer 193, it is possible to prevent moisture or oxygen from penetrating from a side surface of the display area DA, and it is possible to delay the penetration by forming a penetration path of moisture or oxygen to be long and complicated.

Figure 11:
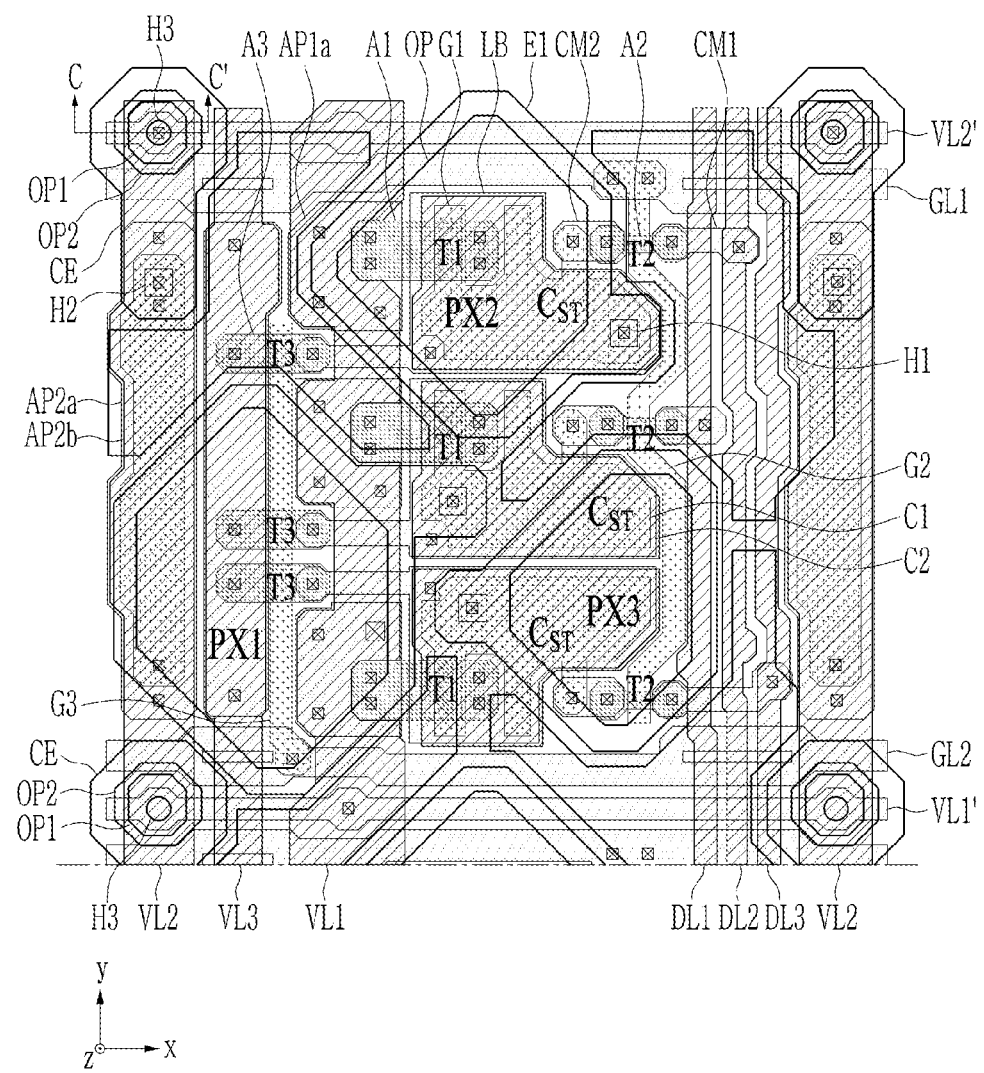
FIG. 11 illustrates a plan view of an embodiment of a pixel area of a light-emitting display device.
Figure 12:
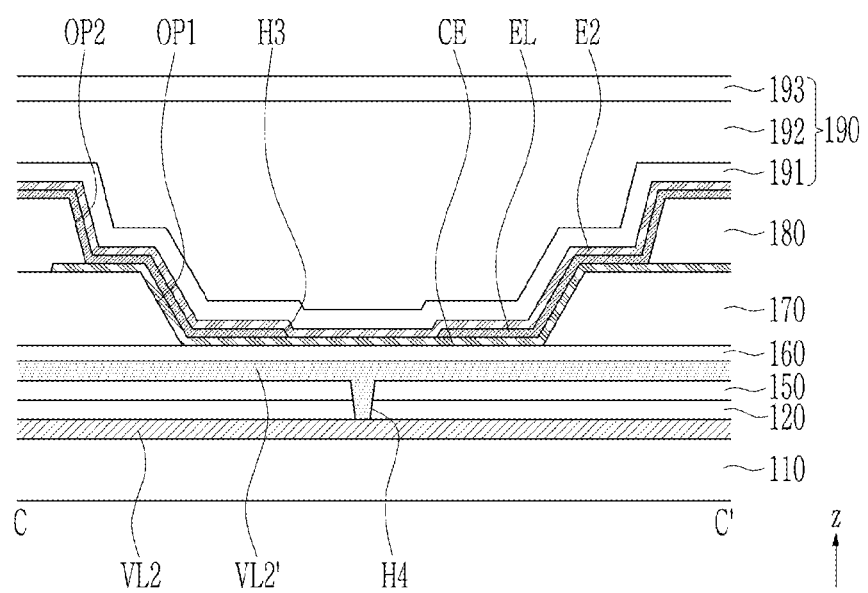
FIG. 12 illustrates a cross-sectional view taken along line C-C' of FIG. 11.

FIG. 11 illustrates a plan view of an embodiment of a pixel area of a light-emitting display device in an embodiment, and FIG. 12 illustrates a cross-sectional view taken along line C-C' of FIG. 11.

In the display device illustrated in FIG. 11 and FIG. 12, the disposition and shape of constituent elements are different from those of the above-described embodiment, but the connection relationship between the constituent elements may be substantially the same as that of the display device of the above-described embodiment.

In further detail, the first conductive layer that may include the data lines DL1, DL2, and DL3, the driving voltage line VL1, the common voltage line VL2, the initializing voltage line VL3, and the light-blocking pattern LB may be disposed on the substrate 110. The data lines DL1, DL2, and DL3, the driving voltage line VL1, the common voltage line VL2, and the initializing voltage line VL3 may extend in the second direction y.

The buffer layer 120 may be disposed on the first conductive layer. The semiconductor layers A1, A2, and A3 of the transistors T1, T2, and T3 may be disposed on the buffer layer 120. The first insulating layer 140 may be disposed on the semiconductor layers A1, A2, and A3. The second conductive layer that may include the gate electrodes G1, G2, and G3 of the transistors T1, T2, and T3, the first electrode C1 of the storage capacitor $C_{ST}$, and the auxiliary pattern AP2b of the common voltage line VL2 may be disposed on the first insulating layer 140.

The second insulating layer 150 may be disposed on the second conductive layer. The third conductive layer that includes the first gate line GL1, the second gate line GL2, the second electrode C2 of the storage capacitor $C_{ST}$, the auxiliary driving voltage line VL1', the auxiliary common voltage line VL2', the auxiliary pattern AP1a of the driving voltage line VL1, the auxiliary pattern AP2a of the common voltage line VL2, and the connecting members CM1 and CM2 may be disposed on the second insulating layer 150. The first gate line GL1, the second gate line GL2, the auxiliary driving voltage line VL1' and the auxiliary common voltage line VL2' may extend in the first direction x. The first gate line GL1 may be connected to the gate electrode G2 through a contact hole defined in the second insulating layer 150. The second gate line GL2 may be connected to the gate electrode G3 through a contact hole defined in the second insulating layer 150. The second electrode C2 may configure the storage capacitor $C_{ST}$ together with the first electrode C1. The auxiliary driving voltage line VL1' may be connected to the driving voltage line VL1 through a contact hole defined in the second insulating layer 150 and the buffer layer 120. The auxiliary common voltage line VL2' may be connected to the common voltage line VL2 through a contact hole H4 defined in the second insulating layer 150 and the buffer layer 120. The contact hole H4 may overlap the opening OP1. The auxiliary pattern AP1a may be connected to the driving voltage line VL1 through a contact hole defined in the second insulating layer 150 and the buffer layer 120, and may be connected to the first area of the semiconductor layer A1 through a contact hole defined in the second insulating layer 150. The auxiliary pattern AP2a may be connected to the auxiliary pattern AP2b through a contact hole defined in the second insulating layer 150, and may be connected to the common voltage line VL2 through a contact hole defined in the second insulating layer 150 and the buffer layer 120. The connecting member CM1 may be connected to the data lines DL1, DL2, and DL3 through a contact hole defined in the second insulating layer 150 and the buffer layer 120, and may be connected to the first area of the semiconductor layer A2 through a contact hole defined in the second insulating layer 150. The connecting member CM2 may be connected to the first electrode C1 through a contact hole defined in the second insulating layer 150, and may be connected to the second area of the semiconductor layer A2 through a contact hole defined in the second insulating layer 150.

The third insulating layer 160 may be disposed on the third conductive layer. The first organic insulating layer 170 in which the opening OP1 overlapping the common voltage line VL2 and the auxiliary common voltage line VL2' is defined may be disposed on the third insulating layer 160. The fourth conductive layer that may include the pixel electrode E1 of the light-emitting diode LED, the connecting electrode CE thereof, or the like may be disposed on the first organic insulating layer 170. The pixel electrode E1 may be connected to the second electrode C2 through the contact hole H1 defined in the first organic insulating layer 170. The connecting electrode CE may be connected to the auxiliary pattern AP2a of the common voltage line VL2 through the contact hole H2 defined in the first organic insulating layer 170 and the third insulating layer 160. The connecting electrode CE may be disposed in the opening OP1 of the first organic insulating layer 170, and may contact the third insulating layer 160.

The second organic insulating layer 180 in which the opening OP overlapping the pixel electrode E1 and the opening OP2 overlapping the opening OP1 are defined may be disposed on the fourth conductive layer. The opening OP2 may overlap the common voltage line VL2 and the auxiliary common voltage line VL2'. The opening OP2 may have an area larger than an area of the opening OP1 and may surround the opening OP1, and the opening OP1 may be defined within the opening OP2. The opening OP2 may have a width wider than a width of the opening OP1.

The light-emitting layer EL in which the contact hole H3 overlapping the openings OP1 and OP2 is defined may be disposed on the fourth conductive layer. In a plan view, the contact hole H3 may be surrounded by the openings OP1 and OP2, and may be defined within the openings OP1 and OP2. The contact hole H3 may overlap the common voltage line VL2 and the auxiliary common voltage line VL2'. As described above, the contact hole H3 of the light-emitting layer EL may be defined by a laser drilling process. Since the opening OP1 is defined in the first organic insulating layer 170, the first organic insulating layer 170 may not be disposed in the area irradiated with the laser during the laser drilling process. Accordingly, it is possible to prevent a gas from occurring from the first organic insulating layer 170 even though the temperature of the area in which the laser is irradiated increases, and accordingly, it is possible to prevent degradation of the light-emitting layer due to the gas from the first organic insulating layer 170 during the laser drilling process. The opening OP1, the opening OP2, and the contact hole H3 may be defined in an area (e.g., at opposite sides of the lower portion in FIG. 11) in which the common voltage line VL2 and the auxiliary driving voltage line VL1' cross.

The common electrode E2 may be disposed on the light-emitting layer EL. The common electrode E2 may be connected to the connecting electrode CE through the contact hole H3 defined in the light-emitting layer EL, and may be applied with the common voltage $EL_{VSS}$ through the connecting electrode CE. The encapsulation layer 190 including the first inorganic layer 191, the organic layer 192, and the second inorganic layer 193 may be disposed on the light-emitting layer EL.

FIG. 13, FIG. 14, FIG. 15, and FIG. 16 respectively illustrate a cross-sectional view of an embodiment of an area in which a contact hole is defined in a light-emitting layer in a light-emitting display device.

Figure 13:
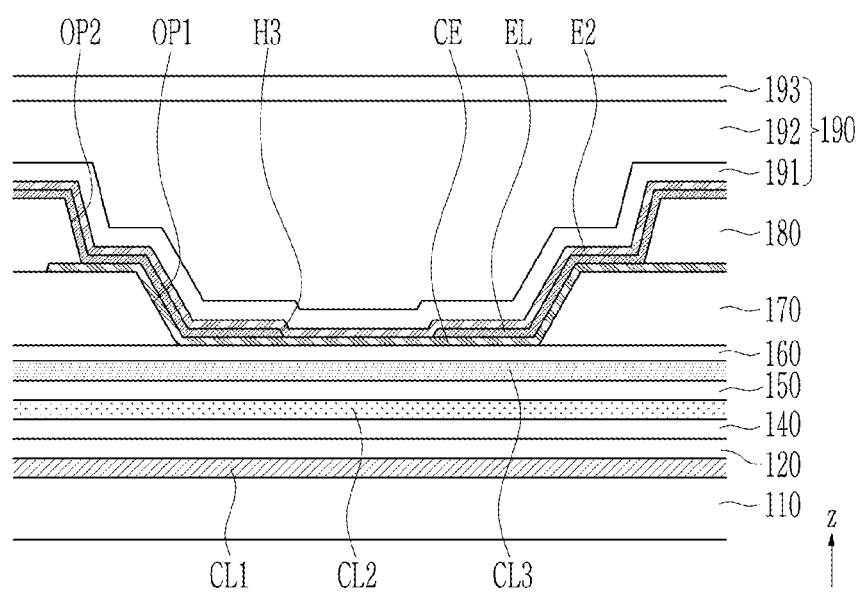
FIG. 13, FIG. 14, FIG. 15, and FIG. 16 each illustrates a cross-sectional view of an embodiment of an area in which a contact hole is defined in a light-emitting layer in a light-emitting display device.
Figure 14:
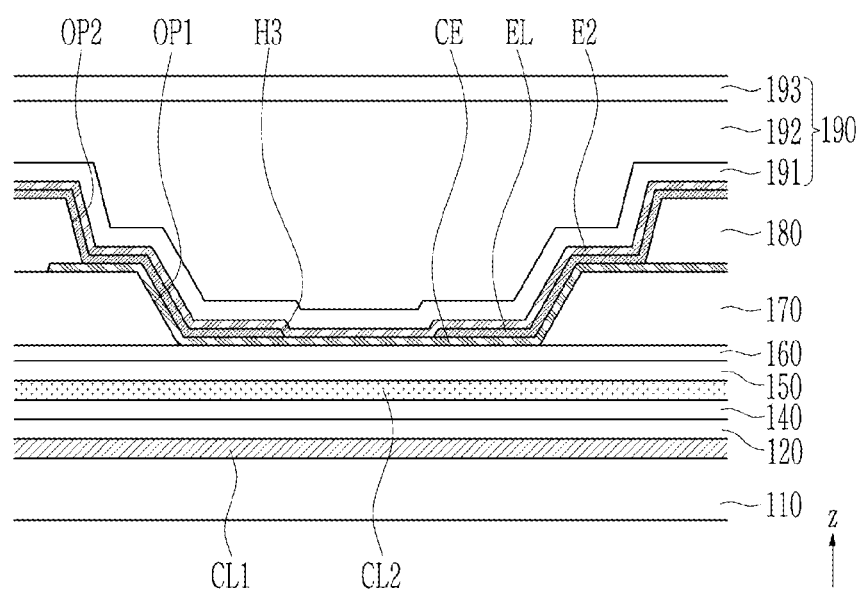
Figure 15:
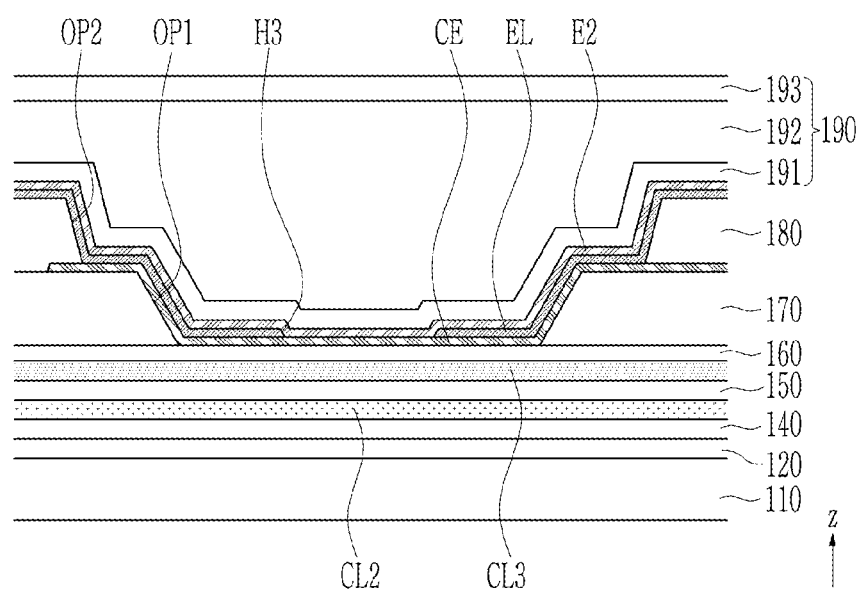
Figure 16:
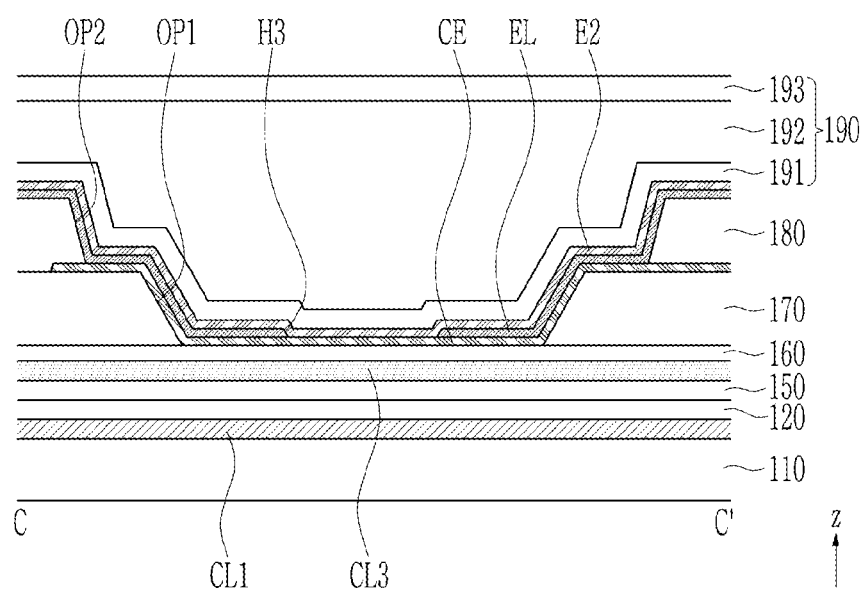

The area in which the contact hole H3 is defined in the light-emitting layer EL by the laser drilling process may be variously changed. Referring to FIG. 13, the contact hole H3 may be defined in an area in which a first conductive layer CL1, a second conductive layer CL2, and a third conductive layer CL3 overlap. The first conductive layer CL1 may be the common voltage line VL2, and may be another wire or electrode included in the first conductive layer CL1, such as the driving voltage line VL1, the initializing voltage line VL3, and the data lines DL1, DL2, and DL3. The second conductive layer CL2 may be the auxiliary pattern AP2b of the common voltage line VL2, and may be another wire or electrode included in the second conductive layer CL2, such as the auxiliary pattern AP1b of the driving voltage line VL1, the gate electrodes G1, G2, and G3, and the first electrode C1 of the storage capacitor $C_{ST}$. The third conductive layer CL3 may be the auxiliary pattern AP2a of the common voltage line VL2, and may be another wire or electrode included in the third conductive layer CL3, such as the first gate line GL1, the second gate line GL2, the second electrode C2 of the storage capacitor $C_{ST}$, the auxiliary driving voltage line VL1', the auxiliary common voltage line VL2', the auxiliary pattern AP1a of the driving voltage line VL1, and the auxiliary pattern AP3a of the initializing voltage line VL3. Referring to FIG. 14, the contact hole H3 may be defined in an area in which the first conductive layer CL1 and the second conductive layer CL2 overlap. Referring to FIG. 15, the contact hole H3 may be defined in an area in which the second conductive layer CL2 and the third conductive layer CL3 overlap. Referring to FIG. 16, the contact hole H3 may be defined in an area in which the first conductive layer CL1 and the third conductive layer CL3 overlap.

In either case, the first organic insulating layer 170 may be removed in the lower portion of the contact hole H3, and the contact hole H3 may be defined within the opening OP1 of the first organic insulating layer 170. Accordingly, it is possible to prevent deterioration of the light-emitting layer EL by a gas occurring from the first organic insulating layer 170 due to heat during the laser drilling process.

Figure 17:
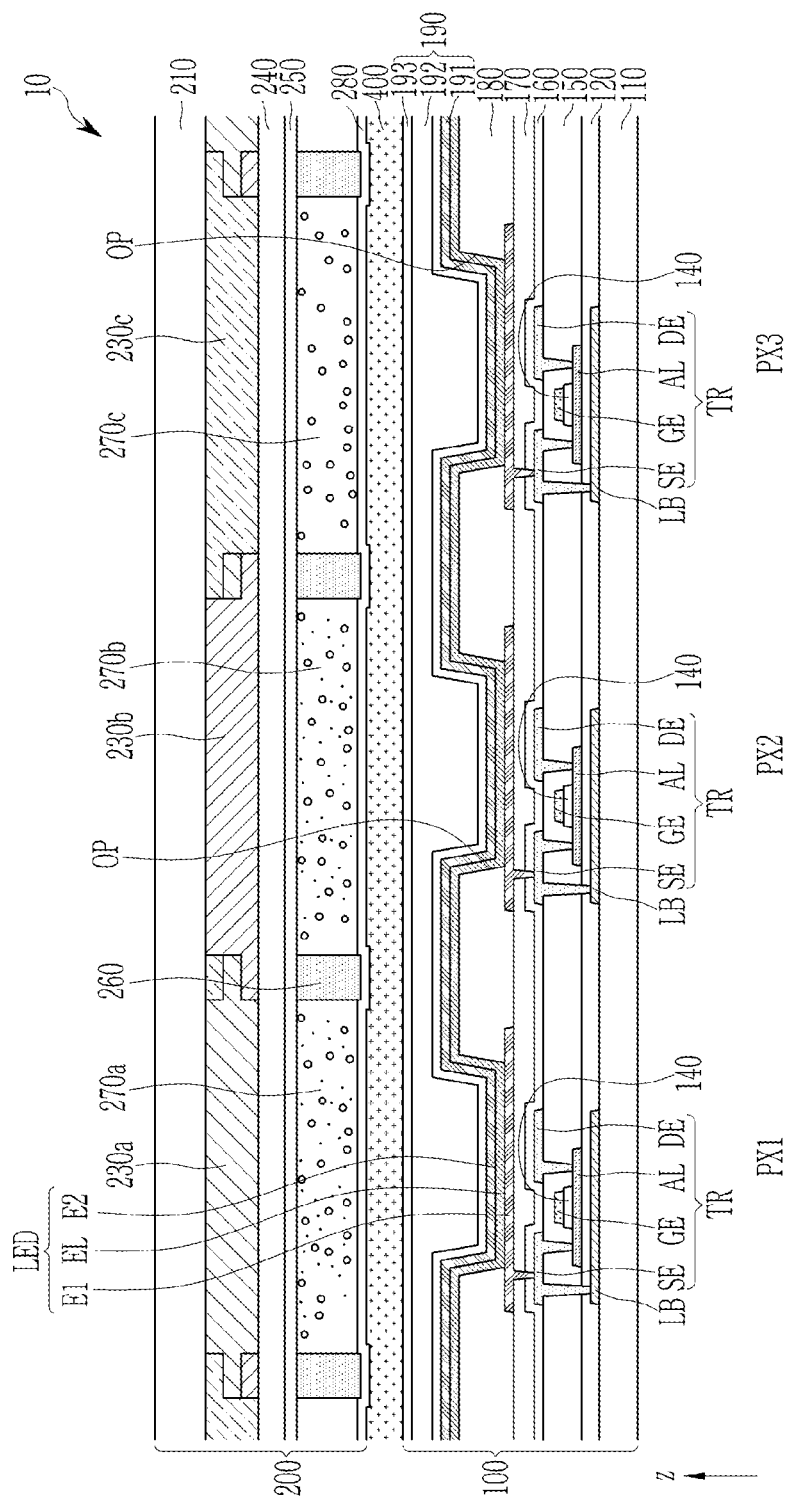
FIG. 17 illustrates a schematic cross-sectional view of an embodiment of a display area in a light-emitting display device.

FIG. 17 illustrates a schematic cross-sectional view of an embodiment of a display area in a light-emitting display device.

Referring to FIG. 17, a display panel 10 may include a display portion 100, a color converting portion 200, and a filler 400 disposed between the display portion 100 and the color converting portion 200.

The display portion 100 may basically include a substrate 110, a transistor TR formed or disposed on the substrate 110, and a light-emitting diode LED connected to the transistor TR. The transistor TR may include a semiconductor layer AL, a gate electrode GE, a first electrode SE, and a second electrode DE. The first electrode SE may be connected to the first area and the light-blocking pattern LB of the semiconductor layer AL, and the second electrode DE may be connected to the second area of the semiconductor layer AL. The illustrated transistor TR may be the first transistor T1. Since the display portion 100 has been described in detail above, the color converting portion 200 and the filler 400 will now be described.

The color converting portion 200 may be disposed on the encapsulation layer 190 of the display portion 100.

The color converting portion 200 may include a substrate 210. The substrate 210 may include an insulating material such as glass or plastic, e.g., the substrate 210 may be a glass substrate.

Color filters 230a, 230b, and 230c may be disposed on the substrate 210 in a direction toward the display portion 100. In the display area DA, the color filters 230a, 230b, and 230c may overlap the openings OP of the second organic insulating layer 180. The color filters 230a, 230b, and 230c may include a first color filter 230a that transmits light of a first wavelength and absorbs light of the remaining wavelength, a second color filter 230b that transmits light of a second wavelength and absorbs light of the remaining wavelength, and a third color filter 230c that transmits light of a third wavelength and absorbs light of the remaining wavelength. The first color filter 230a, the second color filter 230b, and the third color filter 230c may overlap the first pixel PX1, the second pixel PX2, and the third pixel PX3, respectively. Accordingly, purity of the light of the first wavelength (corresponding to the first pixel PX1), the light of the second wavelength (corresponding to the second pixel PX2), and the light of the third wavelength (corresponding to the third pixel PX3) emitted to the outside of the display panel 10 may be increased. The light of the first wavelength, the light of the second wavelength, and the light of the third wavelength may be red light, green light, and blue light, respectively.

At boundaries of the pixels PX1, PX2, and PX3, the first color filter 230a, the second color filter 230b, and the third color filter 230c may overlap each other to form a light-blocking region. As illustrated, the first color filter 230a, the second color filter 230b, and the third color filter 230c may all overlap to form the light-blocking region, but two color filters may overlap to form a light-blocking region. In an embodiment, the first color filter 230a and the second color filter 230b may overlap at a boundary between the first pixel PX1 and the second pixel PX2, the second color filter 230b and the third color filter 230c may overlap at a boundary between the second pixel PX2 and the third pixel PX3, and the third color filter 230c and the first color filter 230a may overlap a boundary between the third pixel PX3 and the first pixel PX1, for example. In the non-display area NA, the first color filter 230a, the second color filter 230b, and the third color filter 230c may overlap each other to form a light-blocking region. The third color filter 230c, the first color filter 230a, and the second color filter 230b are stacked in this order on the substrate 210, but they may be stacked in a different order. Instead of the overlapping of the color filters 230a, 230b, and 230c, it is possible to provide a light-blocking region by forming a light-blocking member.

A low refractive index layer 240 may be disposed on the color filters 230a, 230b, and 230c. The low refractive index layer 240 may be disposed on an entirety of the substrate 210. The low refractive index layer 240 may include an organic material or inorganic material having a low refractive index. The refractive index of the low refractive index layer 240 may be about 1.1 to about 1.3. The low refractive index layer 240 may be disposed at a position different from an illustrated embodiment. In an embodiment, the low refractive index layer 240 may be disposed between color converting layers 270a and 270b and a transmitting layer 270c and a second capping layer 280, for example. The color converting portion 200 may include a plurality of low refractive index layers. In an embodiment, the color converting portion 200 may further include a low refractive index layer disposed between the color converting layers 270a and 270b and the transmitting layer 270c and the second capping layer 280, in addition to the low refractive index layer 240 disposed between the color filters 230a, 230b, and 230c and a first capping layer 250 as illustrated, for example.

The first capping layer 250 may be disposed on the low refractive index layer 240. The first capping layer 250 may be disposed to cover an entirety of the low refractive index layer 240, and may protect the low refractive index layer 240. The first capping layer 250 may include an inorganic insulating material such as a silicon oxide, a silicon nitride, and a silicon oxynitride, and may be a single layer or a multilayer.

A bank 260 may be disposed on the first capping layer 250. The bank 260 may be disposed in the display area DA, and may overlap the second organic insulating layer 180. The bank 260 may overlap a light-blocking region in which the first color filter 230a, the second color filter 230b, and the third color filter 230c overlap each other. The bank 260 may be disposed at the boundaries of the pixels PX1, PX2, and PX3. The bank 260 may partition a pixel area. The bank 260 may include an organic insulating material such as an acryl-based polymer, an imide-based polymer, or an amide-based polymer. The bank 260 may be a black bank including a colored pigment such as a black pigment, but may also be transparent.

The first color converting layer 270a, the second color converting layer 270b, and the transmitting layer 270c may be disposed on the first capping layer 250. The first color converting layer 270a, the second color converting layer 270b, and the transmitting layer 270c may be disposed in a space defined by the bank 260 (that is, in the opening of the bank 260). The first color converting layer 270a, the second color converting layer 270b, and the transmitting layer 270c may be partitioned or separated by the bank 260. The first color converting layer 270a, the second color converting layer 270b, and the transmitting layer 270c may be formed by an inkjet printing process.

The first color converting layer 270a may overlap the first color filter 230a. The first color converting layer 270a may overlap the light-emitting diode LED corresponding to the first pixel PX1, and may convert light incident from the light-emitting diode LED into light of the first wavelength. The light of the first wavelength may be red light having a maximum light-emitting peak wavelength of about 600 nanometers (nm) to about 650 nm, e.g., about 620 nm to about 650 nm.

The second color converting layer 270b may overlap the second color filter 230b. The second color converting layer 270b may overlap the light-emitting diode LED corresponding to the second pixel PX2, and may convert light incident from the light-emitting diode LED into light of the second wavelength. The light of the second wavelength may be green light having a maximum light-emitting peak wavelength of about 500 nm to about 550 nm, e.g., about 510 nm to about 550 nm.

The transmitting layer 270c may overlap the third color filter 230c. The transmitting layer 270c may overlap the light-emitting diode LED corresponding to the third pixel PX3, and may transmit light incident from the light-emitting diode LED. The light transmitting through the transmitting layer 270c may be light of the third wavelength. The light of the third wavelength may be blue light having a maximum light-emitting peak wavelength of about 380 nm to about 480 nm, for example about 420 nm or more, about 430 nm or more, about 440 nm or more, or about 445 nm or more, and about 470 nm or less, about 460 nm or less, or about 455 nm or less.

The first color converting layer 270a and the second color converting layer 270b may include first quantum dots and second quantum dots, respectively. In an embodiment, light incident to the first color converting layer 270a may be converted into light of the first wavelength by the first quantum dots and emitted, for example. Light incident to the second color converting layer 270b may be converted into light of the second wavelength by the second quantum dots and emitted. The first color converting layer 270a, the second color converting layer 270b, and the transmitting layer 270c may include scatterers. The scatterers may improve light efficiency by scattering light incident to the first color converting layer 270a, the second color converting layer 270b, and the transmitting layer 270c.

Each of the first quantum dot and the second quantum dot (hereinafter, the quantum dot is also referred to as a semiconductor nanocrystal) may independently include a group II-VI compound, a group III-V compound, a group IV-VI compound, a group IV element or compound, a group compound, a group compound, a group I-II-IV-VI compound, or any combinations thereof.

The Group II-VI compound may be selected from a binary element compound selected from CdSe, CdTe, ZnS, ZnSe, ZnTe, ZnO, HgS, HgSe, HgTe, MgSe, MgS, and any combinations thereof, a ternary element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combinations thereof, and a quaternary element compound selected from CdZnSeS, CdZnSeTe, CdZnSTe, CdHgSeS, CdHgSeTe, CdHgSTe, HgZnSeS, HgZnSeTe, HgZnSTe, and any combinations thereof. The group II-VI compound may further include a group III metal.

The group III-V compound may be selected from a binary element compound selected from GaN, GaP, GaAs, GaSb, AlN, AlP, AlAs, AlSb, InN, InP, InAs, InSb, and any combinations thereof, a ternary element compound selected from GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and any combinations thereof, and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combinations thereof. The group III-V compound may further include a group II metal.

The Group IV-VI compound may be selected from a binary element compound selected from SnS, SnSe, SnTe, PbS, PbSe, PbTe, and any combinations thereof, a ternary element compound selected from SnSeS, SnSeTe, SnSTe, PbSeS, PbSeTe, PbSTe, SnPbS, SnPbSe, SnPbTe, and any combinations thereof, and a quaternary element compound selected from SnPbSSe, SnPbSeTe, SnPbSTe, and any combinations thereof.

The group IV element or compound may be selected from a singular element compound selected from Si, Ge, and any combinations thereof, and a binary element compound selected from SiC, SiGe, and any combinations thereof.

The group compound may be selected from $CuInSe_2$, $CuInS_2$, CuInGaSe, and CuInGaS.

The group compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and any combinations thereof.

The group I-II-IV-VI compound may be selected from CuZnSnSe and CuZnSnS.

The quantum dot may not include cadmium. The quantum dot may include a semiconductor nanocrystal based on a group III-V compound including indium and phosphorus. The group III-V compound may further include zinc. The quantum dot may include a semiconductor nanocrystal based on a group II-VI compound including a chalcogen element (e.g., sulfur, selenium, tellurium, or any combinations thereof) and zinc.

In the quantum dot, the binary element compound, the ternary element compound, and/or the quaternary element compound, which are described above, may be in particles at uniform concentrations, or they may be divided into states having partially different concentrations to be in the same particle, respectively. In addition, a core/shell structure in which some quantum dots enclose some other quantum dots may be possible. An interface between the core and the shell may have a concentration gradient in which a concentration of elements of the shell decreases closer to its center.

In some embodiments, the quantum dot may have a core-shell structure that includes a core including the nanocrystal described above and a shell surrounding the core. The shell of the quantum dot may serve as a passivation layer for maintaining a semiconductor characteristic by preventing chemical denaturation of the core and/or as a charging layer for applying an electrophoretic characteristic to the quantum dot. The shell may be a single layer or a multilayer. An interface between the core and the shell may have a concentration gradient in which a concentration of elements of the shell decreases closer to its center. An embodiment of the shell of the quantum dot may include a metal or nonmetal oxide, a semiconductor compound, or any combinations thereof.

The metal or non-metal oxide may be a binary element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, or a ternary element compound such as $MgAl_2O_4$, $CoFe_2O_4$, $NiFe_2O_4$, $CoMn_2O_4$, or the like.

The semiconductor compound may be, e.g., CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like.

The quantum dot may have a full width at half maximum of the light-emitting wavelength spectrum of about 45 nm or less, about 40 nm or less, or about 30 nm or less, and in this range, color purity or color reproducibility may be improved. In addition, since light emitted through the quantum dot is emitted in all directions, a viewing angle may be improved.

In the quantum dot, the shell material and the core material may have different energy band gaps. In an embodiment, the energy band gap of the shell material may be larger or smaller than that of the core material, for example. The quantum dot may have a multi-layered shell. In the multi-layered shell, an energy band gap of an outer layer thereof may be larger than that of an inner layer thereof (that is, a layer closer to the core). In the multi-layered shell, the energy band gap of the outer layer may be smaller than the energy band gap of the inner layer.

A shape of the quantum dot is not particularly limited. In an embodiment, the shape of the quantum dot may be a sphere, a polyhedron, a pyramid, a multi-pod, a square, a cuboid, a nanotube, a nanorod, a nanowire, a nanosheet, or any combinations thereof, for example.

The quantum dot may include an organic ligand (e.g., having a hydrophobic moiety and/or a hydrophilic moiety). The organic ligand moiety may be bound to a surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or any combinations thereof. Here, R is independently a $C_3$ to $C_{40}$ substituted or unsubstituted aliphatic hydrocarbon group such as a $C_3$ to $C_{40}$ (e.g., $C_5$ or greater and $C_{24}$ or less) substituted or unsubstituted alkyl, or a substituted or unsubstituted alkenyl, a $C_6$ to $C_{40}$ (e.g., $C_6$ or greater and $C_{20}$ or less) substituted or unsubstituted aromatic hydrocarbon group such as a substituted or unsubstituted $C_6$ to $C_{40}$ aryl group, or any combinations thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol, an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine, a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid, a phosphine compound such as methyl phosphine, ethyl phosphine, propyl phosphine, butyl phosphine, pentyl phosphine, octylphosphine, dioctyl phosphine, tributylphosphine, or trioctylphosphine, a phosphine compound or an oxide compound thereof such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, or trioctylphosphine oxide, a diphenyl phosphine, a triphenyl phosphine compound, or an oxide compound thereof, $C_5$ to $C_{20}$ alkyl phosphinic acid or a $C_5$ to $C_{20}$ alkyl phosphonic acid such as hexylphosphinic acid, octylphosphinic acid, dodecane phosphinic acid, tetradecane phosphinic acid, hexadecane phosphinic acid, octadecane phosphinic acid, or the like. The quantum dot may include a hydrophobic organic ligand alone or in a combination of at least one type.

The hydrophobic organic ligand may not include a photopolymerizable moiety (e.g., acrylate group, methacrylate group, etc.).

The second capping layer 280 may be disposed on the bank 260. The second capping layer 280 may be disposed to cover an entirety of the substrate 210. The second capping layer 280 may cover the first color converting layer 270a, the second color converting layer 270b, and the transmitting layer 270c. The second capping layer 280 may include an inorganic insulating material such as a silicon oxide, a silicon nitride, and a silicon oxynitride, and may be a single layer or a multilayer.

The low refractive index layer 240, the first capping layer 250, and the second capping layer 280 may cover side surfaces of the color filters 230a, 230b, and 230c at an edge of the color converting portion 200. The low refractive index layer 240, the first capping layer 250, and the second capping layer 280 may be formed or provided up to an edge of the substrate 210, and the low refractive index layer 240 may contact the substrate 210 at the edge of the color converting portion 200. The low refractive index layer 240, the first capping layer 250, and the second capping layer 280 may form a blocking member that prevents moisture, oxygen, or the like from penetrating from the edge of the color converting portion 200.

The filler 400 may be disposed between the color converting portion 200 and the display portion 100. The filler 400 may fill a space between the display portion 100 and the color converting portion 200 to increase the pressing resistance between the display portion 100 and the color converting portion 200. One surface of the filler 400 may contact the second capping layer 280, and the other surface of the filler 400 may contact the encapsulation layer 190. The filler 400 may be formed by applying a filler material on the second capping layer 280, overlapping the display portion 100, and then curing the filler material. The filler 400 may include an organic material such as an epoxy resin.

While this disclosure has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A light-emitting display device comprising:
   a substrate;
   a common voltage line which is disposed on the substrate and transmits a common voltage;
   a first organic insulating layer which is disposed on the common voltage line and in which a first opening is defined;
   a connecting electrode disposed on the first organic insulating layer and connected to the common voltage line;
   a second organic insulating layer which is disposed on the first organic insulating layer and in which a second opening overlapping the first opening is defined;
   a light-emitting layer which is disposed on the connecting electrode and the second organic insulating layer and in which a contact hole overlapping the first opening and the second opening is defined; and
   a common electrode disposed on the light-emitting layer and connected to the connecting electrode through the contact hole.

2. The light-emitting display device of claim 1, wherein the contact hole is defined within the first opening, and has a width narrower than a width of the first opening.

3. The light-emitting display device of claim 1, wherein the second opening surrounds the first opening, and has a wider width than a width of the first opening.

4. The light-emitting display device of claim 1, wherein the connecting electrode contacts a side surface of the first organic insulating layer defining the first opening.

5. The light-emitting display device of claim 1, wherein the first opening, the second opening, and the contact hole overlap the common voltage line.

6. The light-emitting display device of claim 1, further comprising
an insulating layer disposed between the common voltage line and the connecting electrode,
wherein the connecting electrode contacts the insulating layer in an area overlapping the first opening.

7. The light-emitting display device of claim 6, further comprising
a first auxiliary pattern disposed between the common voltage line and the insulating layer and connected to the common voltage line,
wherein the connecting electrode is connected to the first auxiliary pattern through a contact hole defined in the first organic insulating layer and the insulating layer.

8. The light-emitting display device of claim 7, further comprising
a second auxiliary pattern disposed between the common voltage line and the first auxiliary pattern,
wherein the first auxiliary pattern is connected to the second auxiliary pattern.

9. The light-emitting display device of claim 8, wherein the first opening and the second opening overlap the first auxiliary pattern and the second auxiliary pattern.

10. The light-emitting display device of claim 6, further comprising
an auxiliary common voltage line disposed between the common voltage line and the insulating layer and connected to the common voltage line,
wherein the first opening, the second opening, and the contact hole overlap the auxiliary common voltage line.

11. The light-emitting display device of claim 10, further comprising
an inorganic insulating layer disposed between the common voltage line and the auxiliary common voltage line,
wherein the auxiliary common voltage line is connected to the common voltage line through a contact hole which is defined in the inorganic insulating layer and overlaps the first opening.

12. The light-emitting display device of claim 6, further comprising
a driving voltage line disposed between the substrate and the insulating layer and transmitting a driving voltage, and
an auxiliary driving voltage line disposed between the driving voltage line and the insulating layer and connected to the driving voltage line,
wherein the first opening, the second opening, and the contact hole overlap the auxiliary driving voltage line.

13. The light-emitting display device of claim 1, wherein the second organic insulating layer covers an edge of the connecting electrode.

14. A light-emitting display device comprising:
a substrate;
a common voltage line which is disposed on the substrate and transmits a common voltage;
a buffer layer disposed on the common voltage line;
an auxiliary pattern disposed on the buffer layer and connected to the common voltage line;
a first inorganic insulating layer disposed on the auxiliary pattern;
a first organic insulating layer which is disposed on the first inorganic insulating layer and in which a first opening is defined;
a connecting electrode disposed on the first organic insulating layer and connected to the auxiliary pattern;
a second organic insulating layer disposed on the first organic insulating layer and covering an edge of the connecting electrode;
a light-emitting layer which is disposed on the connecting electrode and the second organic insulating layer and in which a contact hole overlapping the first opening is defined; and
a common electrode disposed on the light-emitting layer and connected to the connecting electrode through the contact hole.

15. The light-emitting display device of claim 14, wherein the contact hole is surrounded by the first opening.

16. The light-emitting display device of claim 14, wherein the first opening overlaps the common voltage line.

17. The light-emitting display device of claim 14, wherein the connecting electrode covers a side surface of the first organic insulating layer defining the first opening.

18. The light-emitting display device of claim 14, wherein
the connecting electrode is connected to the auxiliary pattern through a contact hole defined in the first organic insulating layer and the first inorganic insulating layer, and
the contact hole defined in the first organic insulating layer and the first inorganic insulating layer is spaced apart from the first opening.

19. The light-emitting display device of claim 14, wherein a second opening overlapping the first opening and having a width wider than a width of the first opening is defined in the second organic insulating layer.

20. The light-emitting display device of claim 14, further comprising
a pixel electrode disposed between the first organic insulating layer and the second organic insulating layer,
wherein the pixel electrode constitutes a light-emitting diode together with the light-emitting layer and the common electrode.

* * * * *